(12) United States Patent
Higashi et al.

(10) Patent No.: US 10,351,961 B2
(45) Date of Patent: Jul. 16, 2019

(54) WATER DECOMPOSITION APPARATUS AND WATER DECOMPOSITION METHOD

(71) Applicants: FUJIFILM Corporation, Tokyo (JP); Japan Technological Research Association of Artifical Photosynthetic Chemical Process, Tokyo (JP)

(72) Inventors: Kohei Higashi, Kashiwa (JP); Naotoshi Sato, Kashiwa (JP)

(73) Assignees: FUJIFILM Corporation, Tokyo (JP); JAPAN TECHNOLOGICAL RESEARCH ASSOCIATION OF ARTIFICIAL PHOTOSYNTHETIC CHEMICAL PROCESS, Tokyo (JP)

(*) Notice: Subject to any disclaimer, the term of this patent is extended or adjusted under 35 U.S.C. 154(b) by 317 days.

(21) Appl. No.: 15/392,440

(22) Filed: Dec. 28, 2016

(65) Prior Publication Data
US 2017/0107631 A1    Apr. 20, 2017

Related U.S. Application Data

(63) Continuation of application No. PCT/JP2015/062568, filed on Apr. 24, 2015.

(30) Foreign Application Priority Data

Aug. 1, 2014  (JP) ................. 2014-158184

(51) Int. Cl.
*C25B 1/00* (2006.01)
*C25B 9/08* (2006.01)
(Continued)

(52) U.S. Cl.
CPC .............. *C25B 1/003* (2013.01); *C01B 3/042* (2013.01); *C25B 1/10* (2013.01); *C25B 9/00* (2013.01);
(Continued)

(58) Field of Classification Search
None
See application file for complete search history.

(56) References Cited

FOREIGN PATENT DOCUMENTS

JP    2004-197167 A    7/2004
JP    2004-315942 A    11/2004
(Continued)

OTHER PUBLICATIONS

English translations of the International Preliminary Report on Patentability and Written Opinion of the International Searching Authority (forms PCT/IB/373, PCT/ISA/237 and PCT/IB/338), dated Feb. 16, 2017, for International Application No. PCT/JP2015/062568.

(Continued)

*Primary Examiner* — Kishor Mayekar
(74) *Attorney, Agent, or Firm* — Birch, Stewart, Kolasch & Birch, LLP

(57) ABSTRACT

Provided are a water decomposition apparatus and a water decomposition method that can maintain high gas generation efficiency even in an early stage of light irradiation and even in a case where time has elapsed and that can recover the gas generation amount of hydrogen gas or the like, can generate hydrogen gas or the like stably for a long time on an average, and can increase the integrated amount of generation of hydrogen for a long time, even in a case where time has elapsed and the gas generation amount of hydrogen gas or the like has decreased.

21 Claims, 11 Drawing Sheets

(51) Int. Cl.
*H01L 31/04* (2014.01)
*C25B 11/04* (2006.01)
*H01L 31/032* (2006.01)
*C25B 1/10* (2006.01)
*C25B 15/02* (2006.01)
*C25B 9/00* (2006.01)
*C01B 3/04* (2006.01)
*H01L 31/072* (2012.01)
*H01L 31/0749* (2012.01)

(52) U.S. Cl.
CPC ............ *C25B 9/08* (2013.01); *C25B 11/04* (2013.01); *C25B 11/0447* (2013.01); *C25B 15/02* (2013.01); *H01L 31/0322* (2013.01); *H01L 31/0326* (2013.01); *H01L 31/04* (2013.01); *H01L 31/072* (2013.01); *H01L 31/0749* (2013.01); *Y02E 10/541* (2013.01); *Y02E 60/368* (2013.01)

(56) References Cited

FOREIGN PATENT DOCUMENTS

| | | |
|---|---|---|
| JP | 2012-52184 A | 3/2012 |
| JP | 2012-177160 A | 9/2012 |

OTHER PUBLICATIONS

International Search Report, issued in PCT/JP2015/062568, PCT/ISA/210, dated Jun. 16, 2015.

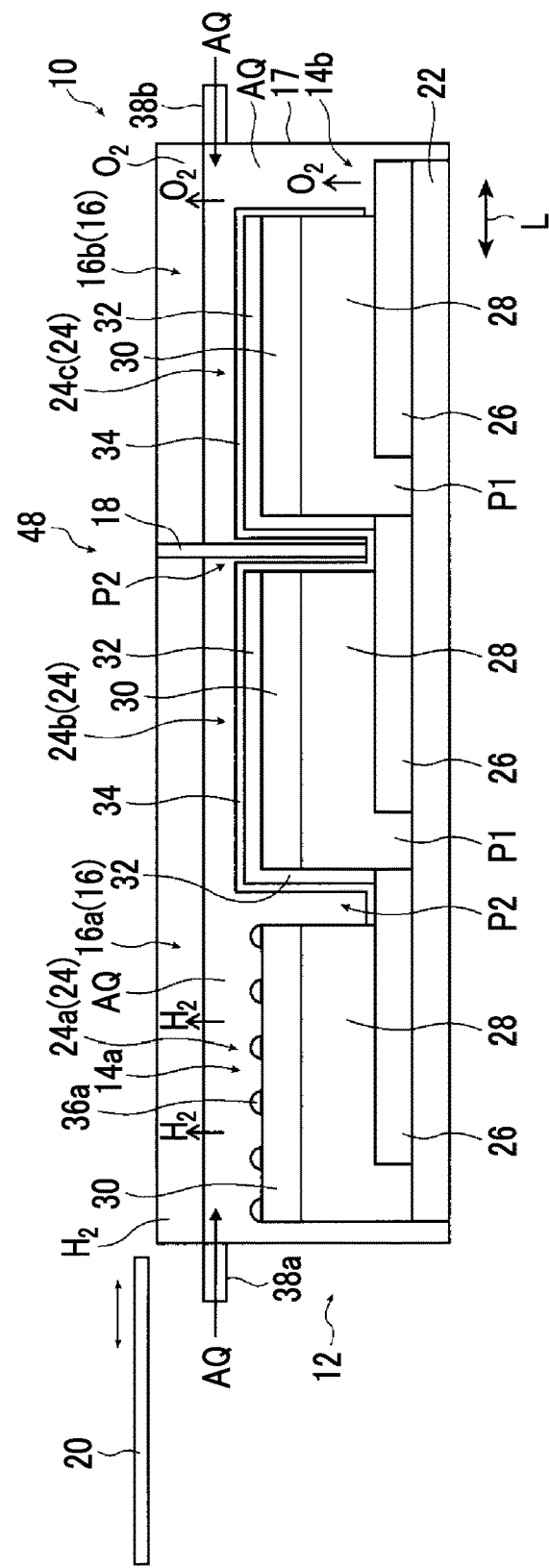

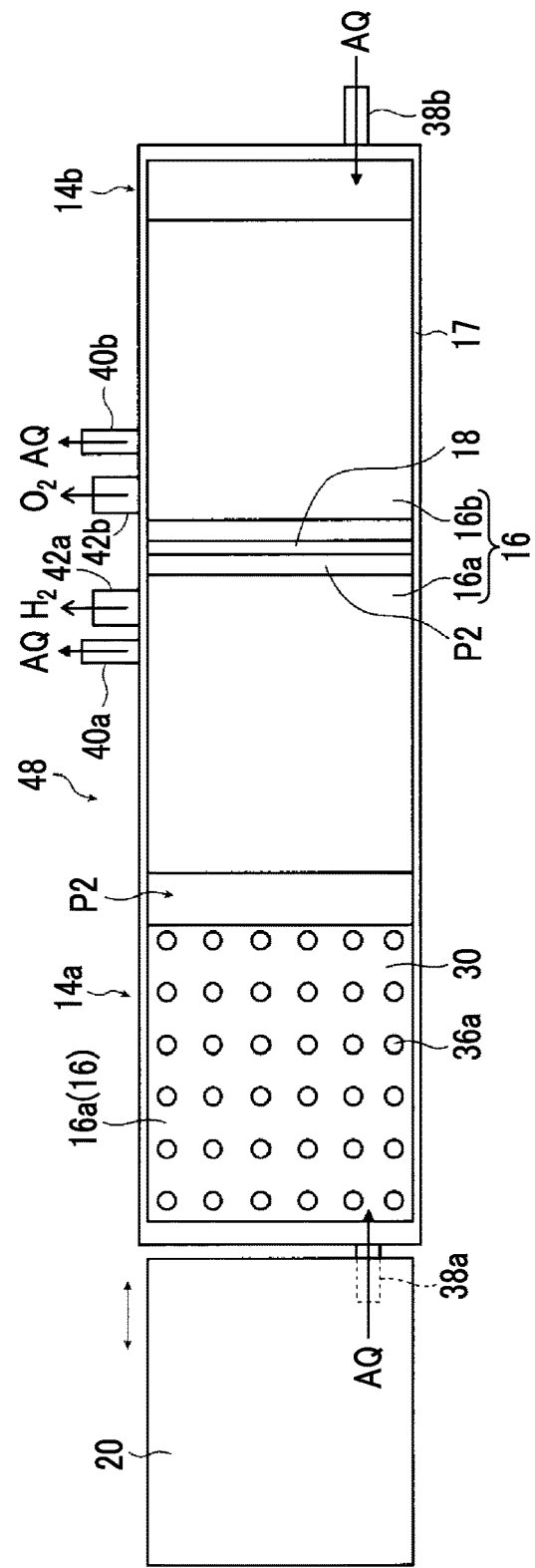

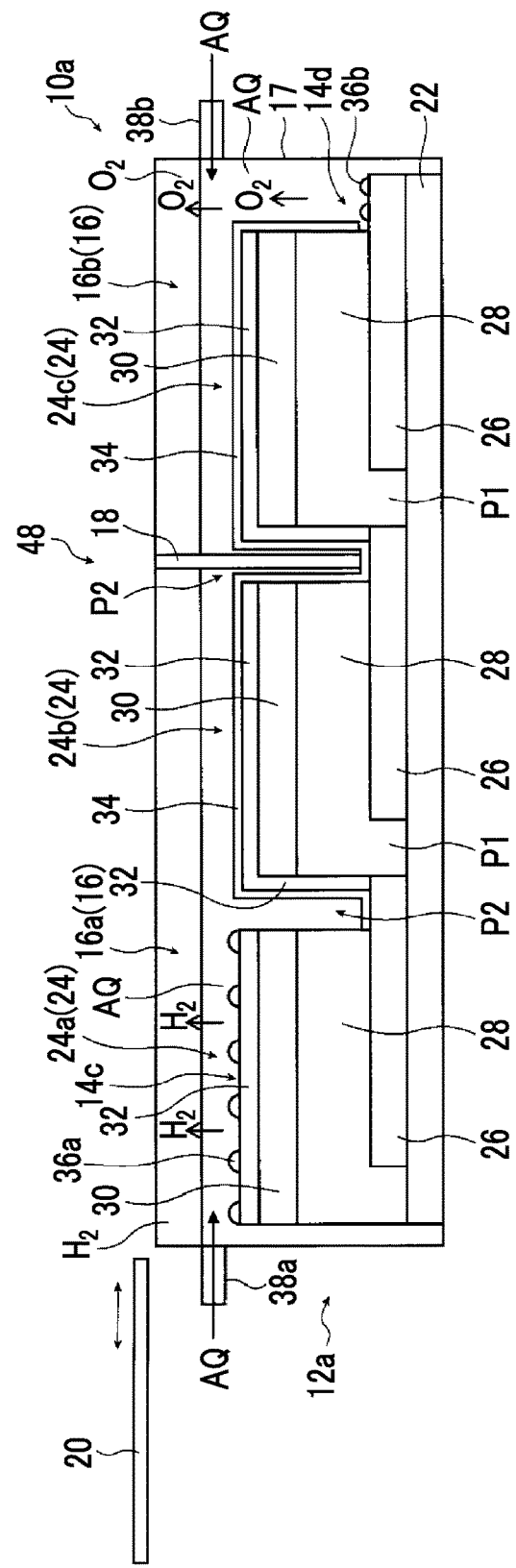

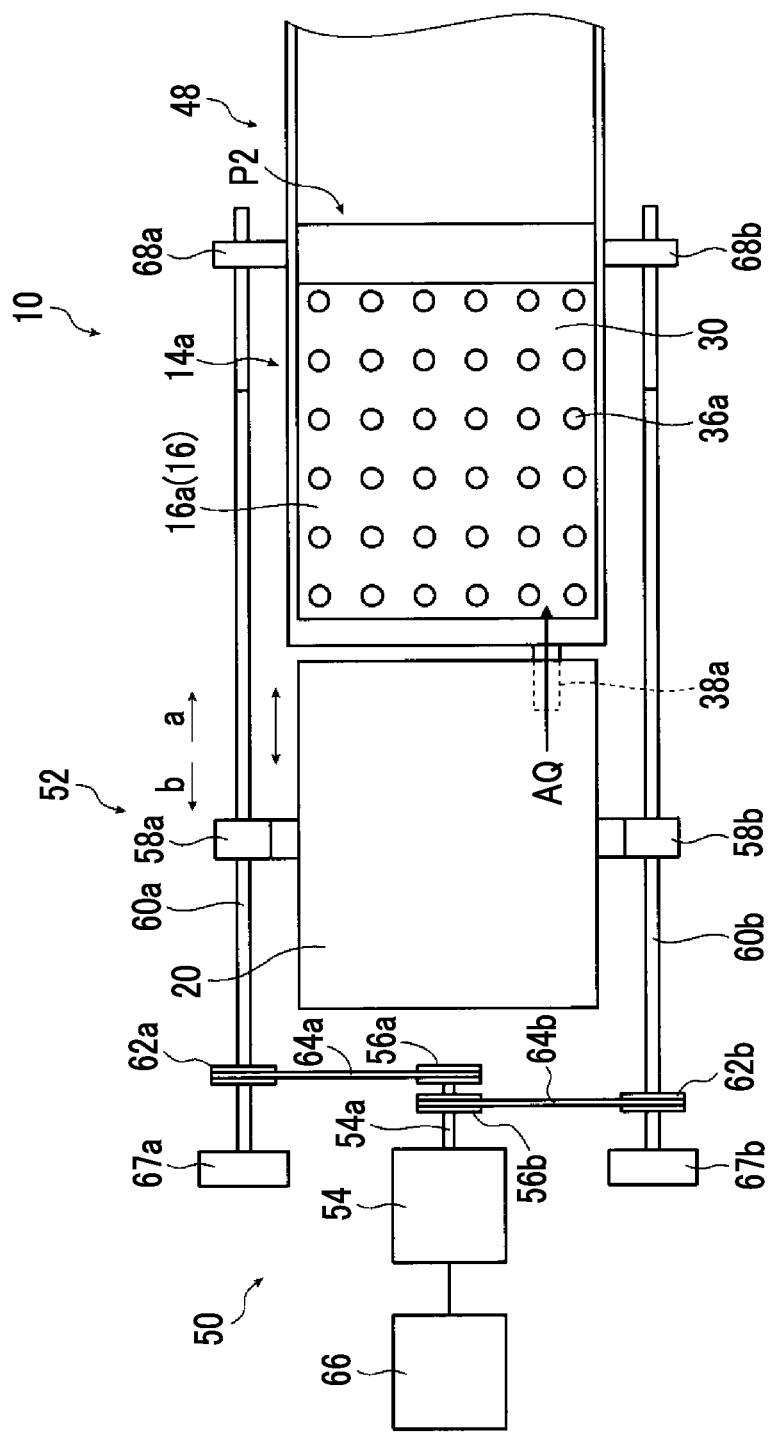

WATER DECOMPOSITION APPARATUS AND WATER DECOMPOSITION METHOD

CROSS-REFERENCE TO RELATED APPLICATIONS

This application is a Continuation of PCT International Application No. PCT/JP2015/062568 filed on Apr. 24, 2015, which claims priority under 35 U.S.C. § 119(a) to Japanese Patent Application No. 2014-158184 filed on Aug. 1, 2014. The above application is hereby expressly incorporated by reference, in its entirety, into the present application.

BACKGROUND OF THE INVENTION

1. Field of the Invention

The present invention relates to a water decomposition apparatus and a water decomposition method that receives light to decompose water to generate hydrogen gas and oxygen gas, and particularly, to a water decomposition apparatus and a water decomposition method that includes a mechanism which shields a hydrogen generation electrode including an inorganic semiconductor film having a pn junction and a hydrogen generation catalyst at regular time intervals, and generates hydrogen gas and oxygen gas.

2. Description of the Related Art

In the related art, as one of the forms in which solar light energy is utilized as renewable energy, hydrogen production apparatuses that use a photoelectric conversion material utilized for solar batteries, and produce hydrogen gas used for fuel cells or the like, utilizing electrons and holes obtained in photoelectric conversion for an electrolysis reaction of water are suggested (for example, refer to JP2012-177160A and JP2004-197167A).

Additionally, as one of the forms in which visible light, such as solar light, is utilized, a hydrogen generation apparatus that uses a photocatalyst, and decomposes water to produce hydrogen gas, utilizing the photocatalyst for a reduction reaction of water, is suggested (for example, refer to JP2012-052184).

Both the hydrogen production apparatuses disclosed in JP2012-177160A and JP2004-197167A disclose that a photoelectric conversion part or a solar battery in which two or more pn junctions that generate an electromotive force if solar light is radiated are connected in series is provided, an electrolytic solution chamber is provided on a lower side of the photoelectric conversion part or the solar battery opposite to a light-receiving surface that receives solar light on the upper side of the photoelectric conversion part or the solar battery, the inside of the electrolytic chamber is divided by an ion-conductive partition wall or a barrier, and hydrogen gas is generated by electrolyzing water with electric power generated in the photoelectric conversion part or the solar battery through reception of solar light.

Since the hydrogen production apparatus disclosed in JP2012-177160A can further adjust the orientation of the light-receiving surface with respect to solar light, the amount of incident light to be subjected to photoelectric conversion can be increased, and hydrogen generation efficiency cannot be decreased.

Additionally, since the hydrogen production apparatus disclosed in JP2004-197167A electrolyzes water using electrode plates connected to p-type and n-type semiconductors of the solar battery as an anode and a cathode, respectively, the efficiency of conversion from solar energy to hydrogen gas can be made high.

Additionally, the hydrogen generation apparatus disclosed in JP2012-052184 has a photocatalyst obtained by doping 4 to 10 mol % of Rh in a Ti site of $SrTiO_3$, uses a photocatalyst electrode showing p-type semiconductor properties, and can generate hydrogen under radiation of visible light, such as solar light, even under an application condition of an external bias, which is lower than a theoretical decomposition voltage of water.

Additionally, JP2012-052184 discloses that, under the application conditions of the external bias, if controlled-potential electrolysis measurement is performed while visible light is radiated intermittently (at one-minute intervals) over a long time of 25 hours, the amount of a cathode current resulting from a reduction reaction of water increases gradually together with light irradiation time and has no great change even if visible light is shielded in the middle. Additionally, JP2012-052184 discloses that, under no application conditions of the external bias, if controlled-potential electrolysis measurement is performed while visible light from a xenon lamp is radiated intermittently (at one-minute intervals) over a long time of 25 hours, the amount of the cathode current resulting from the reduction reaction of water decreases gradually together with the light irradiation time and recovery thereof is shown even if visible light is shielded in the middle, but in a case where the controlled-potential electrolysis measurement is performed while solar light from a solar simulator is radiated intermittently (at one-minute intervals), the amount of the cathode current decreases gradually after having increased gradually together with the light irradiation time, and has no great change even if visible light is shielded in the middle.

SUMMARY OF THE INVENTION

Meanwhile, in the hydrogen production apparatuses disclosed in JP2012-177160A and JP2004-197167A, in the electrolytic solution chamber on the side opposite to the light-receiving surface of the photoelectric conversion part or the solar battery, that is, the back surface side, hydrogen and oxygen are generated by electrolyzing water. Therefore, if gas, such as the generated hydrogen or oxygen, adheres to a gas generation electrode of the photoelectric conversion part, or gas generation surfaces of the electrode plates or the like of the solar battery, and stagnates between the gas generation surfaces, and an aqueous solution, such as an electrolytic solution, the contact area between the gas generation surfaces and the aqueous solution decreases. Therefore, there is a problem that the gas generation efficiency of hydrogen, oxygen, and the like decreases.

Additionally, the hydrogen production apparatuses disclosed in JP2012-177160A and JP2004-197167A have the following problems. That is, if time elapses even if high gas generation efficiency is exhibited particularly in an early stage of gas generation, the amount of gas that stagnates between the gas generation surfaces and the aqueous solution, such as an electrolytic solution, increases and the contact area between the gas generation surfaces and the aqueous solution decreases further. Therefore, there is a problem that the gas generation efficiency of hydrogen, oxygen, and the like is greatly decreased, and stable gas generation cannot not be performed.

Moreover, in the hydrogen production apparatus disclosed JP2012-177160A and JP2004-197167A, the amount of generated gas, such as hydrogen gas, is great in an early stage of light irradiation. However, since the amount of generated gas decreases with the elapse of time, there is a problem that the integrated amount of generation of hydrogen gas or the like for a long time is small.

Additionally, the hydrogen generation apparatus of disclosed in JP2012-052184 discloses that the amount of the cathode current decreases gradually with the light irradiation time and the recovery thereof is shown if visible light is shielded in the middle. However, even if shielding is performed for about 1.25 hours after irradiation is performed for about 3.75 hours and light irradiation is resumed after shielding, a decrease in the amount of the cathode current accompanying the elapse of time becomes large. As a result, sufficient recovery is not shown even if shielding is performed after that. Therefore, the amount of generated gas, such as hydrogen gas, decreases with the elapse of time. As a result, there is a problem that the integrated amount of generation of hydrogen gas for a long time or the like is small.

An object of the invention is to solve the above related-art problems and to provide a water decomposition apparatus and a water decomposition method that can maintain high gas generation efficiency even in an early stage of light irradiation and even in a case where time has elapsed and that can recover the gas generation amount of hydrogen gas or the like, can generate hydrogen gas or the like stably for a long time on an average, and can increase the integrated amount of generation of hydrogen gas for a long time, even in a case where time has elapsed and the gas generation amount of hydrogen gas or the like has decreased.

In order to achieve the above object, a water decomposition apparatus of the invention is a water decomposition apparatus that decomposes an electrolyte aqueous solution into hydrogen gas and oxygen gas by means of light. The water decomposition apparatus comprises a hydrogen gas generating part that includes an inorganic semiconductor film having a pn junction and one surface as a light-receiving surface, and a hydrogen generation catalyst and that generates hydrogen gas; an oxygen gas generating part that is formed on the other surface of the inorganic semiconductor film and generates oxygen gas; an electrolytic chamber that contains the electrolyte aqueous solution coming into contact with the hydrogen gas generating part and the oxygen gas generating part, and the hydrogen gas and the oxygen gas generated in the hydrogen gas generating part and the oxygen gas generating part; and a shielding mechanism that shields at least a portion of light with which the hydrogen gas generating part is irradiated. The shielding mechanism shields the hydrogen gas generating part at regular time intervals.

Here, it is preferable that the shielding mechanism shields 70% or more of the light with which the hydrogen gas generating part is irradiated.

Additionally, it is preferable that the shielding mechanism is a shielding structure, and the shielding structure moves a light irradiation position where the hydrogen gas generating part is irradiated with light and a shielding position where the hydrogen gas generating part is shielded, at the regular time intervals. Otherwise, it is preferable that the shielding mechanism is a rotational movement mechanism that rotationally moves an apparatus body including the hydrogen gas generating part, the oxygen gas generating part, and the electrolytic chamber, in which the apparatus body is moved to a light irradiation position where the hydrogen gas generating part is irradiated with light, and a shielding position where the hydrogen gas generating part is shielded, at the regular time intervals by the rotational movement mechanism.

Additionally, it is preferable that a photoelectromotive force E (V) between the hydrogen gas generating part and the oxygen gas generating part satisfy the following Formula (1) if a water decomposition starting voltage of the electrolyte aqueous solution is defined as Es (V).

$$Es(V) < E(V) < Es + 0.6(V) \qquad (1)$$

Additionally, it is preferable that the hydrogen generation catalyst is platinum, and it is preferable that the electrolyte aqueous solution includes $Na_2SO_4$.

Additionally, it is preferable to further comprise a barrier that partitions the electrolytic chamber into a region including the hydrogen gas generating part and a region including the oxygen gas generating part and has ion permeability and gas non-permeability.

Additionally, it is preferable that the inorganic semiconductor film includes a CIGS compound semiconductor or a CZTS compound semiconductor.

Additionally, it is preferable to further comprise a controller that controls the shielding mechanism such that a ratio of a shielding time when the hydrogen gas generating part is shielded by the shielding mechanism to a light irradiation time when the hydrogen gas generating part is irradiated with light by the shielding mechanism is 1:2 to 1:100 and the hydrogen gas generating part is shielded at regular time intervals by the shielding mechanism.

In order to achieve the above object, a water decomposition method of the invention is a water decomposition method of decomposing an electrolyte aqueous solution into hydrogen gas and oxygen gas by means of light, using a water decomposition apparatus including a hydrogen gas generating part that includes an inorganic semiconductor film having a pn junction and one surface as a light-receiving surface, and a hydrogen generation catalyst, and an oxygen gas generating part that is formed on the other surface of the inorganic semiconductor film and generates the oxygen gas. The water decomposition method comprises shielding at least a portion of light with which the hydrogen gas generating part is irradiated, at regular time intervals.

Here, it is preferable that 70% or more of the light with which the hydrogen gas generating part is irradiated is shielded.

Additionally, it is preferable that the shielding is performed by moving a shielding structure between a light irradiation position where the hydrogen gas generating part is irradiated with light and a shielding position where the hydrogen gas generating part is shielded, at the regular time intervals. Otherwise, it is preferable the shielding is performed by rotationally moving the water decomposition apparatus between a light irradiation position where the hydrogen gas generating part is irradiated with light and a shielding position where the hydrogen gas generating part is shielded, at the regular time intervals.

Additionally, it is preferable that a photoelectromotive force E (V) between the hydrogen gas generating part and the oxygen gas generating part satisfy the following Formula (1) if a water decomposition starting voltage of the electrolyte aqueous solution is defined as Es (V).

$$Es(V) < E(V) < Es + 0.6(V) \qquad (1)$$

Additionally, it is preferable that the hydrogen generation catalyst is platinum, and it is preferable that the electrolyte aqueous solution includes $Na_2SO_4$.

Additionally, it is preferable that the inorganic semiconductor film includes a CIGS compound semiconductor or a CZTS compound semiconductor.

Additionally, it is preferable that a ratio of a shielding time when the hydrogen gas generating part is shielded by the shielding mechanism to a light irradiation time when the hydrogen gas generating part is irradiated with light by the shielding mechanism is 1:2 to 1:100.

According to the invention, even in an early stage of light irradiation and even in a case where time has elapsed, high gas generation efficiency can be maintained, and even in a case where time has elapsed and the gas generation amount of hydrogen gas or the like has decreased, the gas generation amount of hydrogen gas or the like can be recovered, hydrogen gas or the like can be generated stably for a long time on an average, and the integrated amount of generation of hydrogen gas for a long time can be increased.

BRIEF DESCRIPTION OF THE DRAWINGS

FIGS. 1A and 1B are respectively a sectional view and a top view schematically illustrating one example of a water decomposition apparatus related to one embodiment of the invention.

FIGS. 3A and 3B are respectively a sectional view and a top view schematically illustrating another example of the water decomposition apparatus related to the one embodiment of the invention.

FIG. 4 is a top view schematically illustrating one example of a shielding mechanism of the water decomposition apparatus illustrated in FIG. 1B.

DESCRIPTION OF THE PREFERRED EMBODIMENTS

Figure 2A:
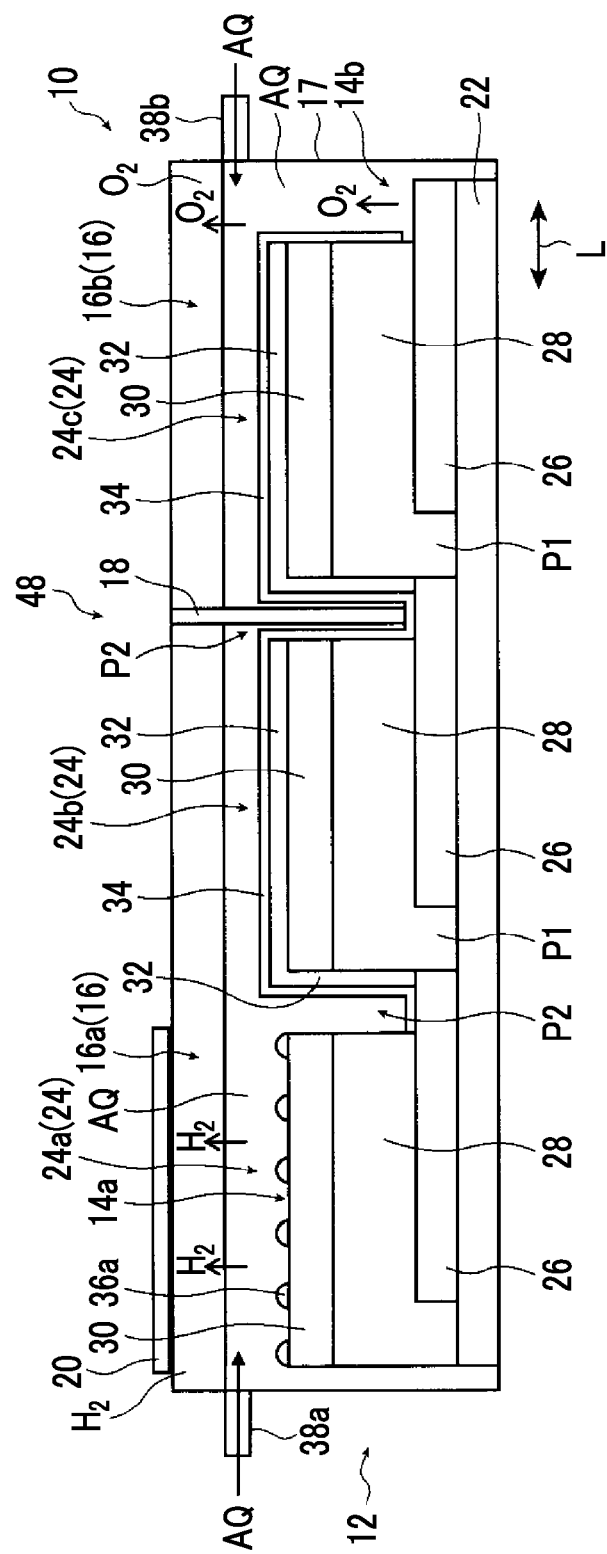
FIGS. 2A and 2B are respectively a sectional view and a top view schematically illustrating one usage pattern of the water decomposition apparatus illustrated in FIGS. 1A and 1B.

Hereinafter, a water decomposition apparatus and a water decomposition method related to the invention will be described in detail on the basis of preferable embodiments illustrated in the attached drawings.

In addition, numerical ranges expressed using "to" in this specification means ranges including numerical values described before and after "to" as lower limits and upper limits.

The invention is an apparatus and method of generating hydrogen gas and oxygen gas from different gas generation surfaces, respectively, by bringing an electrolyte aqueous solution into contact with a gas generation surface of a hydrogen gas generating part disposed toward an outside so as to be capable of absorbing light using one surface of an inorganic semiconductor film having a pn junction as a light-receiving surface including a hydrogen generation catalyst, and a gas generation surface of a oxygen gas generating part formed on the other surface of the inorganic semiconductor film, by irradiating the light-receiving surface with light, and by causing light to the light-receiving surface. Preferably, the invention is an apparatus and a method of generating hydrogen gas and oxygen gas, respectively, in two regions partitioned by a barrier having ion permeability and gas non-permeability in an electrolytic chamber that contains the electrolyte aqueous solution, and a water decomposition apparatus and a water decomposition apparatus method of shielding at least a portion of light, which allows the hydrogen gas generating part to be irradiated therewith, that is, enters the hydrogen gas generating part, at regular time intervals that is very short compared to light irradiation time (exposure time), using a shielding mechanisms, such as a shielding structure.

First, the features of the water decomposition apparatus related to the invention to the related-art apparatuses will be described.

As described above, in the related art, the surface (gas generation surface) of the electrode for electrolysis of the hydrogen gas generating part that generates hydrogen gas is provided on a back surface side of the photoelectric conversion part opposite to the light-receiving surface that receives solar light, and the irradiation of light, that is, the entering (hereinafter simply referred to as irradiation) to the light-receiving surface is continuous or intermittent or is cut off for a relatively long time during the light irradiation time. In contrast, the features of the invention is that the gas generation surface of the hydrogen gas generating part is provided on the same side as the light-receiving surface that receives solar light, and the gas generation surface of the hydrogen gas generating part is shielded at regular time intervals that is very short compared to the light irradiation time by the shielding mechanism, such as a shielding structure. In this way, by disposing the gas generation surface of the hydrogen gas generating part on the light-receiving surface side and shielding at regular time intervals that is very short compared to the light irradiation time, there are obtained desired effects that the gas generation amount of hydrogen gas, oxygen gas, or the like that has described with the elapse of time can be recovered, high gas generation efficiency can be maintained irrespective of the elapse of time, hydrogen gas or the like can be stably produced, a predetermined amount of hydrogen gas or the like can be generated stably for a long time on an average, and the integrated amount of generation of hydrogen gas for a long time can be increased.

Figure 2B:
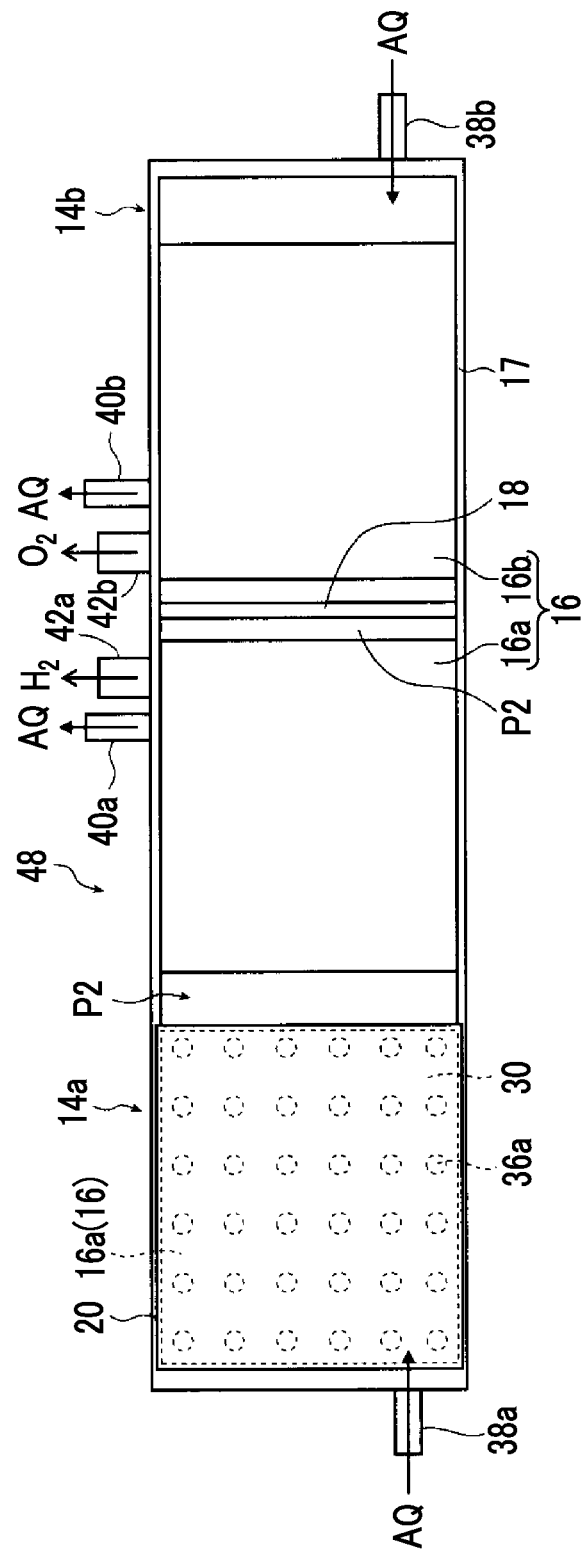

FIGS. 1A and 1B are respectively a sectional view and a top view schematically illustrating one example of a water decomposition apparatus related to a first embodiment of the invention. FIGS. 2A and 2B are respectively a sectional view and a top view schematically illustrating one usage pattern of the water decomposition apparatus illustrated in FIGS. 1A and 1B.

First, as illustrated in this drawing, the water decomposition apparatus 10 has a pn junction module (element junction body) 12 in which a plurality of elements (a plurality of pn junction cells) having an inorganic semiconductor film having a pn junction formed thereon are electrically connected in series, a hydrogen gas generating part 14a and an oxygen gas generating part 14b that are respectively provided at open ends of the pn junction cells at both ends of the pn junction module 12, a container 17 that constitutes an electrolytic chamber 16 that contains an electrolyte aqueous solution AQ coming into contact with these two hydrogen and oxygen gas generating parts 14a and 14b, and hydrogen and oxygen gases generated in the hydrogen and oxygen gas generating parts 14a and 14b, a barrier 18 that partitions the electrolytic chamber 16 into two electrolytic chambers 16a and 16b each including one of the hydrogen and oxygen gas generating parts 14a and 14b, and a shielding plate 20 that shields the hydrogen gas generating part 14a at regular time intervals that are extremely short with respect to light irradiation time in order to cut off the light with which the hydrogen gas generating part 14a is irradiated. In addition, the pn junction module 12, the hydrogen gas generating part 14a, the oxygen gas generating part 14b, the electrolytic chamber 16, a container 17, and a barrier 18 constitute the apparatus body 48.

The pn junction module 12 is provided to receiving light, such as solar light, from a light-receiving surface, to generate hydrogen gas and oxygen gas through a photolysis reaction of water, and is an integrated structure having a supporting substrate 22 that has insulation, and a plurality (three in an illustrated example) pn junction cells 24 (24a, 24b, 24c) that are connected in series in a longitudinal direction of the supporting substrate 22 on the supporting substrate 22.

In the pn junction module 12, three pn junction cells 24 (24a, 24b, 24c) are connected in series along the longitudinal direction L of the supporting substrate 22. In addition, although the number of pn junction cells 24 connected in series will be described below to be three as a representative example, it is needless to say that the number is not limited to three in the illustrated example and may be arbitrary if the sum of the electromotive forces of the pn junction cells 24 is equal to or greater than an electrolysis starting voltage of water.

The supporting substrate 22 is not particularly limited if the supporting substrate has insulation, and such intensity that the supporting substrate can support the three pn junction cells 24 that are connected in series. As the supporting substrate 22, for example, a soda lime glass (SLG) substrate or a ceramic substrate can be used. Additionally, a supporting substrate in which an insulating layer is formed on a metal substrate can be used as the supporting substrate 22. Here, as the metal substrate, a metal substrate, such as an Al substrate or an SUS substrate, or a composite metal substrate, such as a composite Al substrate made of a composite material of Al, and for example, other metal, such as SUS, is available. In addition, the composite metal substrate is also a kind of the metal substrate, and the metal substrate and the composite metal substrate are collectively and simply referred to as a metal substrate. Moreover, a metal substrate with an insulating film having an insulating layer formed by anodizing a surface of the Al substrate or the like can also be used as the supporting substrate 22. The supporting substrate 22 may be flexible or may not be flexible. In addition, in addition to the above-described substrates, for example, a glass plate, such as high strain point glass or non-alkali glass, or a polyimide material can also be used as the supporting substrate 22.

The thickness of the supporting substrate 22 may be an arbitrary thickness without being particularly limited if the pn junction cells 24 that constitutes the pn junction module 12 can be supported. However, for example, about 20 to 20000 μm is acceptable, 100 to 10000 μm is preferable, and 1000 to 5000 μm is more preferable.

In addition, in a case where pn junction cells each including a CIGS compound semiconductor are used as the pn junction cells 24, the photoelectric conversion efficiency of the pn junction cells 24 is improved if alkali ions (for example, sodium (Na) ions: Na+) are supplied to the supporting substrate 22 side. Thus, it is preferable to provide an alkali supply layer that supplies the alkali ions to an upper surface of the supporting substrate 22. In addition, for example, in the case of the SLG substrate, the alkali supply layer is unnecessary.

The pn junction cells 24 consist of an inorganic semiconductor film having a pn junction of the invention, are photoelectric conversion elements each having a laminated structure having the same configuration as a solar battery cell used as a solar battery, and is provided to receive light, such as solar light, from the light-receiving surface, perform photoelectric conversion to generate electrons and holes, and send the generated electrons and holes to the hydrogen and oxygen gas generating parts 14a and 14b, respectively.

In the pn junction cell 24a at a left end in the drawing, a back electrode 26, a photoelectric conversion layer 28, and a buffer layer 30 are laminated sequentially from the supporting substrate 22 side. In the pn junction cell 24a, a hydrogen generation catalyst 36a is formed in islands dotted on the buffer layer 30 that functions as the gas generating part 14a that generates hydrogen.

Meanwhile, in both the pn junction cells 24b and 24c, back electrodes 26, photoelectric conversion layers 28, buffer layers 30, transparent electrodes 32, and a transparent insulating film 34 are laminated sequentially from the supporting substrate 22 side.

Therefore, in the pn junction cells 24 (24a, 24b, 24c), the back electrodes 26, the photoelectric conversion layers 28, the buffer layers 30, the transparent electrodes 32, the transparent insulating film 34, and the hydrogen generation catalyst 36a all extend long in a width direction (a direction perpendicular to a paper plane) orthogonal the longitudinal direction L of the supporting substrate 22. Here, although the details will be described below, it can be said that the inorganic semiconductor film having a pn junction, of the invention is a film having each photoelectric conversion layer 28 consisting of an inorganic semiconductor, such as a p-type CIGS compound semiconductor including at least an n-type CdS or the like at an interface thereof.

In addition, although it can also be said that the pn junction of the inorganic semiconductor film is one formed at an interface between a layer of the inorganic semiconductor, such as a CIGS compound semiconductor, (and each photoelectric conversion layer 28), and a layer (buffer layer 30) of CdS, it is now also possible to consider that a pn junction of a high-efficiency CIGS compound semiconductor film is formed inside the CIGS compound semiconductor on the CdS side. That is, it is also possible to consider that, when Cd buries a defect of Cu on the CIGS compound semiconductor side in a solution growth process of the buffer layer 30, such as a CdS layer, or is replaced with Cu, a donor is generated and consequently, a shallow pn homojunction in which a CIGS compound semiconductor surface layer is reversed to an n type is formed.

In the pn junction module 12, if the pn junction cell 24a is irradiated with light from the buffer layer 30 side, this light enters and passes through the buffer layer 30, an electromotive force is generated in the photoelectric conversion layer 28. On the other hand, if the pn junction cells 24b and 24c are irradiated with light from the transparent electrode 32 side, this light enters the transparent electrodes 32, passes through the transparent electrodes 32 and the buffer layers 30, and electromotive forces are generated in the photoelectric conversion layers 28. In this way, in the pn junction cells 24 (24a, 24b, 24c), for example, movement of charges (electrons) that move toward the buffer layers 30 or the transparent electrodes 32 from the back electrodes 26 occurs. In other words, electric currents (movement of holes) that flow toward the back electrodes 26 from the buffer layers 30 or the transparent electrodes 32 is generated. For this reason, in the pn junction module 12, the buffer layer 30 of the left-end pn junction cell 24a serves as the hydrogen gas generating part 14a (a negative electrode for electrolysis) that generates hydrogen, and the back electrode 26 of the right-end pn junction cell 24c serves as the oxygen gas generating part 14b (a positive electrode for electrolysis) that generates oxygen.

In addition, the type (polarity) of generated gases (hydrogen gas and oxygen gas) of the hydrogen and oxygen gas generating parts 14a and 14b in the pn junction module 12 changes appropriately according to the configuration of the pn junction cells 24, the configuration of the pn junction module 12, or the like.

Each back electrode 26 is separated from back electrodes 26 adjacent thereto by a plurality of separation grooves P1 provided at regular intervals in the longitudinal direction L of the supporting substrate 22.

The back electrode 26 is made of, for example, metals, such as Mo, Cr, and W, or combinations thereof. The back electrode 26 may have a single-layer structure, or may have a laminated structure, such as a two-layer structure. Among these, it is preferable that the back electrode 26 is made of Mo. Although the film thickness of the back electrode 26 is generally about 800 nm, it is preferable that the thickness of the back electrode 26 is 400 to 1000 nm (1 μm).

An extending portion of the back electrode 26 of the pn junction cell 24c serves as the oxygen gas generating part 14b (the positive electrode for electrolysis) that generates oxygen, takes out electrons from hydroxy ions OH— ionized from moisture molecules to generate oxygen molecules (oxygen gas), that is, oxygen (2OH→H2O+O2/2+2e−), and the surface thereof functions as a gas generation surface.

Each photoelectric conversion layer 28 is formed on the back electrode 26 while filling a separation groove P1.

The photoelectric conversion layer 28 is a layer that forms a pn junction having the photoelectric conversion layer 28 side as a p type and having the buffer layer 30 side as an n type at an interface between the photoelectric conversion layer 28 and the buffer layer 30, or forms a pn junction inside the buffer layer 30 side of the photoelectric conversion layer 28, and absorbs light being transmitted through and reaching the buffer layer 30 or the transparent insulating film 34, the transparent electrode 32, and the buffer layer 30 to generate holes on a p side and generate electrons on an n side, and that has a photoelectric conversion function. In the photoelectric conversion layer 28, holes generated in the pn junction are moved from the photoelectric conversion layer 28 to the back electrode 26 side, and electrons generated in the pn junction are moved to the buffer layer 30 side or from the buffer layer 30 to the transparent electrode 32 side. As for the film thickness of the photoelectric conversion layer 28, 1.0 to 3.0 μm is preferable, and 1.5 to 2.0 μm is particularly preferable.

It is preferable that the photoelectric conversion layer 28 is constituted with, for example, a p-type inorganic semiconductor, such as a CIGS compound semiconductor or a CZTS compound semiconductor having a chalcopyrite crystal structure. That is, it is preferable that the photoelectric conversion layer 28 is constituted with a CIGS layer. The CIGS layer may be constituted with well-known things utilized for a CIGS system, such as CuInSe2 (CIS) as well as Cu(In, Ga)Se2.

In addition, as methods for forming the CIGS layer, 1) a multi-source vapor deposition method, 2) a selenide method, 3) a sputtering method, 4) a hybrid sputtering method, 5) a mechanochemical process method, and the like are known.

Other methods for forming the CIGS layer include a screen printing method, a proximity sublimating method, an MOCVD method, a spray method (wet film-forming method), and the like. For example, in the screen printing method (wet film-forming method), the wet film-forming method (wet film-forming method), or the like, crystal having a desired composition can be obtained by forming a particulate film including an 11(Ib) group element, a 3 (IIIb) group element, and a 6 (VIb) group element on a substrate, and executing thermal decomposition processing (may be thermal decomposition processing in a 6 group element atmosphere in this case) or the like (JP1997-74065A(JP-H09-74065A), JP1997-74213(JP-H09-74213A), or the like).

In the invention, as described above, although it is preferable that the photoelectric conversion layer 28 is constituted of, for example, a CIGS compound semiconductor having a chalcopyrite crystal structure, or a CZTS compound semiconductor, the invention is not limited to this. Arbitrary photoelectric conversion elements may be used as long as the photoelectric conversion layer 28 consists of an inorganic semiconductor capable of forming a pn junction, and can generate a photolysis reaction of water and generate hydrogen and oxygen. For example, the photoelectric conversion elements used for the solar battery cells that constitute the solar battery are preferably used. Such photoelectric conversion elements may include thin film silicon-based thin film type photoelectric conversion elements, CdTe-based thin film type photoelectric conversion elements, a dye sensitizing-based thin film type photoelectric conversion elements, or organic-based thin film type photoelectric conversion elements, in addition to CIGS-based thin film type photoelectric conversion elements, CIS-based thin film type photoelectric conversion elements, or CZTS-based thin film type photoelectric conversion elements.

In addition, the absorption wavelength of the inorganic semiconductor that forms the photoelectric conversion layer 28 is not particularly limited if this absorption wavelength is in a wavelength band in which photoelectric conversion is possible. Although the wavelength band may include wavelength bands of solar light or the like, particularly, bands from a visible wavelength band to an infrared wavelength band, it is preferable that an absorption wavelength end thereof includes 800 nm or more, that is, a band up to the infrared wavelength band. This is because solar light energy can be utilized as much as possible. Meanwhile, making the absorption wavelength end long is equivalent to a band gap becoming small. Since this makes it possible to expect that an electromotive force for assisting water decomposition decreases, and consequently makes it possible to expect that the number of pn junction cells that should be connected in series for water decomposition increases. Thus, a longer absorption edge wavelength is not necessarily better.

Each buffer layer 30 consists of, for example, a thin film of CdS or the like, and is formed on the surface of each photoelectric conversion layer 28.

An opening groove P2 that penetrates through the buffer layer 30 and the photoelectric conversion layer 28 and reaches a surface of the back electrode 26 is formed at a position different from a formation position of the separation groove P1, in the longitudinal direction L. Here, a pn junction is formed at the interface between the photoelectric conversion layer 28 and the buffer layer 30 or inside the photoelectric conversion layer 28 on the buffer layer 30 side.

The buffer layer 30 forms a n-type semiconductor layer with respect to the p-type photoelectric conversion layer 28, and forms the pn junction at the interface between the buffer layer 30 and the photoelectric conversion layer 28. Here, in the pn junction cell 24a, a surface of the buffer layer 30 functions as the light-receiving surface on the pn junction consisting of the buffer layer 30 and the photoelectric conversion layer 28, and causes the light having entered the buffer layer 30 directly from the light-receiving surface to be transmitted therethrough up to the photoelectric conversion layer 28. Meanwhile, in each of the pn junction cells 24b and 24c, the buffer layer 30 protects the photoelectric conversion layer 28 when the transparent electrode 32 is formed, and is formed in order to cause the light having entered the transparent electrode 32 to be transmitted therethrough up to the photoelectric conversion layer 28.

It is preferable that the buffer layer 30 includes metal sulfide including at least one kind of metallic element selected from a group consisting of, for example, specifically, Cd, Zn, Sn, and In, such as CdS, ZnS, Zn(S, O), and/or Zn(S, O, OH), SnS, Sn(S, O), and/or Sn(S, O, OH), InS, In(S, O), and/or In(S, O, OH).

The film thickness of the buffer layer 30 is preferably 10 nm to 2 μm, and more preferably, 15 to 200 nm. A chemical bath deposition method (hereinafter referred to as a CBD method), for example, is formed in the formation of the buffer layer 30.

In addition, a window layer, for example, may be provided between the buffer layer 30 and the transparent electrode 32. This window layer is constituted with, for example, a ZnO layer with a thickness of about 10 nm.

The transparent electrode 32 consists of, for example, a transparent conductive film, such as a ZnO:Al film, is formed on the buffer layer 30 in the middle pn junction cell 24b and the right-end pn junction cell 24c, and formed so as to be so as to fill portions of respective opening grooves P2 between the pn junction cells 24a and 24b and between the pn junction cells 24b and 24c, specifically, one-sided side surfaces (respectively, side surfaces of the opening grooves P2 on the pn junction cell 24b and 24c side, in other words, side surfaces of the pn junction cells 24b and 24c on the left side in the drawing).

The transparent electrode 32 has translucency, functions as the light-receiving surface on the pn junction consisting of the buffer layer 30 and the photoelectric conversion layer 28, and functions as an electrode that takes irradiation light into the photoelectric conversion layer 28, and makes a pair with the back electrode 26 to move holes and electrons generated in the photoelectric conversion layer 28 (an electric current flows). Additionally, the transparent electrode 32 functions as a transparent conductive film for directly connecting the pn junction cells 24a and 24b together and directly connecting the pn junction cells 24b and 24c together, specifically, for connecting the back electrode 26 of the pn junction cell 24a to the pn junction cell 24b and connecting the back electrode 26 of the pn junction cell 24b to the pn junction cell 24c, in order to connect the three pn junction cells 24a, 24b, and 24c in series.

In addition, in the left-end pn junction cell 24a, the transparent electrode 32 is not formed on the buffer layer 30. In this case, a region (the buffer layer 30, the photoelectric conversion layer 28) of the left-end pn junction cell 24a with no transparent electrode functions as the hydrogen gas generating part 14a that generates hydrogen and constitutes a hydrogen gas generation region. For this reason, the buffer layer 30 of the left-end pn junction cell 24a serves as the gas generating part 14a (the negative electrode for electrolysis) that generates hydrogen, and supplies electrons to hydrogen ions (protons) H+ ionized from moisture molecules to generate hydrogen molecules (hydrogen gas), that is, hydrogen (2H++2e→H2). Consequently, the buffer layer 30 of the pn junction cell 24a functions as an electrode for generating hydrogen, and the surface of the buffer layer 30 functions as a hydrogen gas generation surface.

The transparent electrode 32 is made of, for example, ZnO in which Al, B, Ga, In, or the like is doped, or ITO (indium tin oxide). The transparent electrode 32 may have a single-layer structure, or may have a laminated structure, such as a two-layer structure. Additionally, the thickness of the transparent electrode is not particularly, limited and is preferably 0.3 to 1 μm.

In addition, methods for forming the transparent electrode are not particularly limited, and the transparent electrode can be formed by an electron beam deposition method, gaseous phase film-forming methods, such as a sputtering method and a CVD method, or a coating method.

In addition, although there is no reason that transparent conductive films for connecting the adjacent pn junction cells 24a and 24b in series and connecting the adjacent pn junction cells 24b and 24c in series are limited to the transparent electrodes 32, the transparent conductive films may be simultaneously formed with the same transparent conductive films as the transparent electrodes 32 from the viewpoint of easiness of manufacture.

Namely, the conductive films for connecting the adjacent pn junction cells 24 in series can be formed by forming opening grooves P2 reaching the surfaces of the back electrodes 26 through laser scribing or mechanical scribing after the buffer layers 30 are laminated on the photoelectric conversion layers 28, forming the transparent conductive films constituting the transparent electrodes 32 on the buffer layers 30 so as to fill the opening grooves P2, then removing left portions, in the drawing, of the transparent conductive films within the opening grooves P2 through the scribing to form slightly small opening grooves P2 reaching the surfaces of the back electrodes 26 again, and leaving the conductive films that directly connect the back electrodes 26 and the transparent electrodes 32 of the adjacent pn junction cells 24 together.

The transparent insulating film 34 is formed so as to cover all the transparent electrodes 32 of the pn junction cells 24b and 24c, side surfaces (side surfaces, on the right side of the drawing, of the pn junction cells 24b and 24c) in which the transparent electrodes 32 are not formed, and the back electrodes 26 of the pn junction cells 24a and 24b that constitute bottom surfaces of two opening grooves P2. In other words, the transparent insulating film 34 is formed so as to cover all conductive portions of the pn junction module 12, excluding the entire outer surface (all outer surfaces of the buffer layer 30 and the photoelectric conversion layer 28 excluding the back electrode 26) of the pn junction cell 24a that constitutes the hydrogen gas generating part 14a, and excluding the extending portion of the back electrode 26 of the pn junction cell 24c that constitutes the oxygen gas generating part 14b.

The transparent insulating film 34 has translucency, and is provided so as to cover portions other than gas generation regions in order to protect portions other than the gas generation regions. The portions other than the gas generation regions mean conductive material surfaces of the pn junction cells 24 that exist in addition to regions including the hydrogen gas generating part 14a that generates hydrogen and the oxygen gas generating part 14b that generates oxygen, that is, the transparent electrodes 32, the buffer layers 30, the photoelectric conversion layers 28, and the back electrodes 26. Specifically, the portions other than the gas generation regions mean all the transparent electrodes 32 of the pn junction cells 24b and 24c, the side surfaces (side surfaces, on the right side of the drawing, of the pn junction cells 24b and 24c) in which the transparent electrodes 32 are not formed, and the back electrodes 26 of the pn junction cells 24a and 24b that constitute the bottom surfaces of the two opening grooves P2.

The transparent insulating film 34 is made of, for example insulating epoxy resin, insulating silicone resin, or the like. Additionally, the thickness of the transparent insulating film 34 is not particularly limited, and is preferably 2 to 100 μm.

In addition, methods for forming the transparent insulating film 34 are not particularly limited, and the transparent insulating film 34 can be formed by a coating method, a sputtering method, and the like.

In addition, although it is necessary to provide the transparent insulating film 34 in a case where the pn junction cells 24 are immersed in the electrolyte aqueous solution, it is not necessary to provide the transparent insulating film 34 in a case where the pn junction cells 24 are not immersed.

As described above, the region of the left-end pn junction cell 24a functions as the hydrogen gas generating part 14a that generates hydrogen and constitutes the hydrogen gas generation region. The buffer layer 30 of the pn junction cell 24a functions as an electrode for generating hydrogen, and the surface of the buffer layer 30 functions as a hydrogen gas generation surface.

The hydrogen generation catalyst 36a for generating hydrogen is formed in islands on the surface of this buffer layer 30 so as to be dotted.

The hydrogen generation catalyst 36a is made of, for example, Pt (platinum), NiOx (nickel oxide), RuO2 (ruthenium oxide), or the like. Additionally, the size of the hydrogen generation catalyst 36a is not particularly limited, and is preferably 0.001 to 1 μm.

In addition, methods for forming the hydrogen generation catalyst 36a are not particularly limited, and the hydrogen generation catalyst 36a can be formed by an optical electrodeposition method, an impregnating method, a sputtering method, a vapor deposition method, and the like.

Additionally, as described above, the extending portion of the back electrode 26 of the right-end pn junction cell 24c functions as an electrode for generating oxygen, and constitutes the oxygen gas generating part 14b that generates oxygen. That is, a flat surface of the extending portion functions as an oxygen gas generation surface, and a flat planar region thereof constitutes an oxygen gas generation region.

Although the pn junction module 12 can be manufactured by the following manufacturing method, the invention is not limited to this.

First, for example, a soda lime glass substrate or the like serving as the supporting substrate 22 is prepared.

Next, for example, an Mo film or the like serving as the back electrodes 26 is formed on the surface of the supporting substrate 22 by a sputtering method using a film-forming apparatus.

Next, for example, the separation grooves P1 extending in the width direction of the supporting substrate 22 are formed by scribing the Mo film at predetermined positions using a laser scribing method. Accordingly, the back electrodes 26 separated from each other by the separation grooves P1 are formed.

Next, for example, a CIGS film (p-type semiconductor layer) is formed as the photoelectric conversion layers 28 so as to cover the back electrodes 26 and fill the separation grooves P1. This CIGS film is formed by one of the aforementioned film-forming methods.

Next, for example, a CdS layer (n-type semiconductor layer) serving as the buffer layers 30, is formed on the photoelectric conversion layers 28 by a chemical bath deposition (CBD) method.

Next, the two opening grooves P2, which extend in the width direction of the supporting substrate 22 and reach the surfaces of the back electrodes 26 via the CIGS layer 16 from the buffer layers 30, are Rimmed at positions different from the foil cation positions of the separation grooves P1, in the illustrated longitudinal direction L. In this case, laser scribing or mechanical scribing can be used as the scribing method.

Next, transparent conductive films serving as the transparent electrodes 32, for example, ZnO:Al layers are formed by a sputtering method or a coating method so as to extend in the width direction of the supporting substrate 22, and fill the opening grooves P2 on the buffer layers 30 other than left-end pn junction cell 24a.

Next, two slightly small opening grooves P2 that reach the surfaces of the back electrodes 26 are formed again by removing portions of the ZnO:Al layers within the opening grooves P2 as so to leave right-side portions in the drawing. Even in this case, laser scribing or mechanical scribing can be used as the scribing method. In this way, the three pn junction cells 24 (24a, 24b, 24c) are formed.

Next, for example, an insulating epoxy resin film serving as the transparent insulating film 34 is formed by a coating method, on the outer surfaces of the pn junction cells 24b and 24c that do not serve as the gas generation regions, and the surfaces of the back electrodes 26 at the bottom surfaces of the two opening grooves P2.

Next, for example, a Pt catalyst serving as the hydrogen generation catalyst 36a is carried on the buffer layer 30 of the pn junction cell 24a, which is not covered with the insulating epoxy resin film and the transparent conductive film, by an optical electrodeposition method.

Accordingly, the pn junction module 12 can be manufactured.

Although the pn junction module 12 of the water decomposition apparatus 10 illustrated in FIG. 1 is configured as described above, the invention is not limited to this.

Figure 3B:
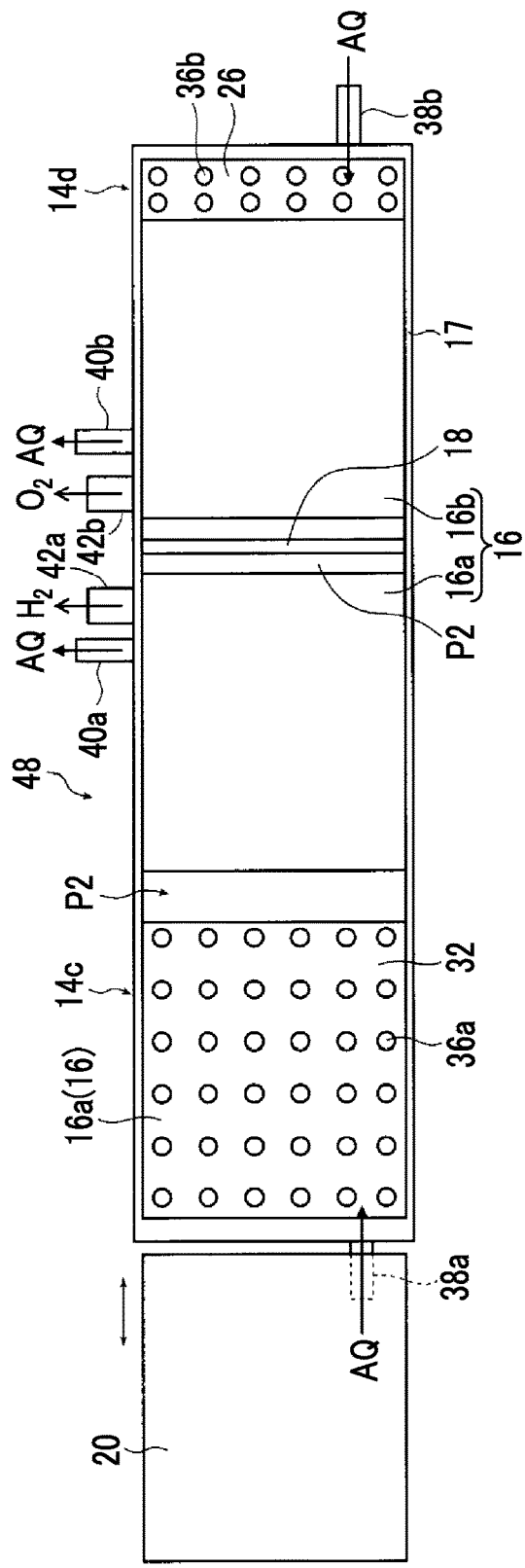

As in a hydrogen gas generating part 14c of a pn junction module 12a of a water decomposition apparatus 10a illustrated in FIG. 3, even in the left-end pn junction cell 24a, the transparent electrode 32 may be formed on the buffer layer 30, and the hydrogen generation catalyst 36a may be formed in islands on the transparent electrode 32 so as to be dotted. In this case, the transparent electrode 32 of the left-end pn junction cell 24a serves as the gas generating part 14a (the negative electrode for electrolysis) that generates hydrogen, and supplies electrons to hydrogen ions (protons) $H^+$ ionized from moisture molecules to generate hydrogen molecules (hydrogen gas), that is, hydrogen ($2H^+ + 2e^- \rightarrow H_2$). That is, the transparent electrode 32 functions as the gas generating part 14c that generates hydrogen, constitutes the hydrogen gas generation region, and functions as an electrode for generating hydrogen, and the surface of the transparent electrode 32 functions as the hydrogen gas generation surface.

In addition, if the generation efficiency of hydrogen or oxygen gas is taken into consideration, it is preferable that the hydrogen generation catalyst 36a is formed in the transparent electrode 32 or the buffer layer 30. However, in the invention, the plurality of pn junction cells 24 can be connected in series. Thus, the sum of the electromotive forces of the plurality of pn junction cells 24 can be made sufficiently higher than the electrolysis starting voltage of water.

In this case, the hydrogen generation catalyst 36a may not be formed in the transparent electrode 32 or the buffer layer 30.

In addition, as illustrated in FIG. 3, in the right-end pn junction cell 24c of the pn junction module 12a, an oxygen generation catalyst 36b may be formed in islands on the surface of the extending portion of the back electrode 26 functioning as an oxygen gas generating part 14d so as to be dotted. The oxygen generation catalyst 36b may extend long in the width direction (the direction perpendicular to the paper plane) orthogonal to the longitudinal direction L of the supporting substrate 22, similar to the hydrogen generation catalyst 36a of the pn junction cell 24a.

Here, the oxygen generation catalyst 36b is made of, for example, $IrO_2$, $CoO_x$, or the like. Additionally, the size of the oxygen generation catalyst 36b is not particularly limited, and is preferably 0.001 to 1 µm.

In addition, methods for forming the oxygen generation catalyst 36b are not particularly limited, and the oxygen generation catalyst 36b can be formed by a dipping method, an impregnating method, a sputtering method, a vapor deposition method, and the like.

For example, in a case where the oxygen generation catalyst 36b is formed, for example, an $IrO_2$ catalyst serving as the oxygen generation catalyst 36b may be carried on the back electrode 26 of another pn junction cell 24c, which is not covered with an insulating epoxy resin film, by a dipping method, after the hydrogen generation catalyst 36a is formed in islands on the transparent electrode 32 of the pn junction cell 24a.

The container 17 houses the pn junction module 12, and constitutes the electrolytic chamber 16 consisting of the electrolytic chamber 16a that contains (stores) the electrolyte aqueous solution AQ coming into contact with an upper surface of the buffer layer 30 of the left-end pn junction cell 24a, or the transparent electrode 32 constituting the hydrogen gas generating part 14a (refer to FIG. 1A) or 14c (refer to FIG. 3A), and the hydrogen that is the gas generated from the hydrogen gas generating part 14a or 14c, and the electrolytic chamber 16b that contains (stores) the electrolyte aqueous solution AQ coming into contact with the upper surface of the extending portion of the back electrode 26 of the right-end pn junction cell 24c constituting the oxygen gas generating part 14b (refer to FIG. 1A) or 14d (refer to FIG. 3A), and the oxygen that is the gas generated from the oxygen gas generating part 14b or 14d.

A supply port 38a for supplying the electrolyte aqueous solution AQ into the electrolytic chamber 16a is provided on a front left side surface (a front left side of the apparatus) in FIG. 1B, of the electrolytic chamber 16a within the container 17, and both a discharge port 40a for discharging the electrolyte aqueous solution AQ within the electrolytic chamber 16a and a recovery port 42a for recovering the hydrogen generated within the electrolytic chamber 16a are provided on an upper (inner) side surface (an inner side of the apparatus) in FIG. 1B, of the electrolytic chamber 16a within the container 17.

A supply port 38b for supplying the electrolyte aqueous solution AQ into the electrolytic chamber 16b is provided on a front right side surface (a front right side of the apparatus) in FIG. 1B, of the electrolytic chamber 16b within the container 17, and both a discharge port 40b for discharging the electrolyte aqueous solution AQ within the electrolytic chamber 16b and a recovery port 42b for recovering the oxygen generated within the electrolytic chamber 16b are provided on an upper (inner) side surface (an inner side of the apparatus) in FIG. 1B, of the electrolytic chamber 16b within the container 17.

The supply port 38a and the discharge port 40a are attached so as to be located at positions slightly above the position of the transparent electrode 32 or the buffer layer 30 so that the flow of water such that the hydrogen generated within the electrolytic chamber 16a in the transparent electrode 32 or the buffer layer 30 of the pn junction cell 24a does not stagnate in the surface the transparent electrode 32 or the buffer layer 30 is formed. For this reason, the surface of the transparent electrode 32 or the buffer layer 30 can always be brought into contact with the electrolyte aqueous solution AQ, and hydrogen can be generated efficiently. In addition, it is natural that the positions of the supply port 38a and the discharge port 40a become a water surface of the electrolyte aqueous solution AQ within the electrolytic chamber 16a.

Meanwhile, since the water surface of the electrolyte aqueous solution AQ within the electrolytic chamber 16b is made the same as or almost the same as the water surface of the electrolyte aqueous solution AQ within the electrolytic chamber 16a, the supply port 38b and the discharge port 40b are attached so as to be located at the same or almost the same positions as the positions of the supply port 38a and the discharge port 40a.

Since hydrogen and oxygen are respectively stored above the water surfaces of the electrolyte aqueous solutions AQ within the electrolytic chambers 16a and 16b, the recovery ports 42a and 42b are attached so as to be located slightly above the positions of the water surfaces of the electrolyte aqueous solutions AQ, that is, slightly above the positions of the supply port 38a and the discharge port 40a, in order to efficiently recover the hydrogen and the oxygen that are stored, respectively.

In the example illustrated in FIGS. 1A and 1B, both the recovery port 42a that recover hydrogen and the recovery port 42b that recovers oxygen are provided in the side surface (inner side of the apparatus) on the inner side within the container 17. However, the invention is not limited to this.

In the water decomposition apparatus of the invention, a recovery port that recovers hydrogen and a recovery port that recovers oxygen may be provided on an upper side (for example, refer to an upper side of FIG. 1A) of the apparatus, that is, an upper ceiling (refer to regions that sandwich the separation membrane 18 of the electrolytic chambers 16a and 16b of FIG. 1B therebetween) of the apparatus. In this way, light hydrogen and oxygen can be efficiently recovered.

The barrier 18 is provided to separate the hydrogen generated within the electrolytic chamber 16a and the oxygen generated within the electrolytic chamber 16b from each other to recovers the generated hydrogen and oxygen in high purity and separate the electrolytic chamber 16 within the container 17 into the electrolytic chamber 16a for generating hydrogen and the electrolytic chamber 16b for generating oxygen in order to allow hydroxy ions and hydrogen ions to pass therethrough such that the hydroxy ions (pH also increases) that have increased due to the generation of the hydrogen within the electrolytic chamber 16a and the hydrogen ions (pH decreases) that have increased due to the generation of the oxygen within the electrolytic chamber 16b neutralize, and is a film that has high ion permeability and high gas non-permeability.

The barrier 18 is brought into close contact with and attached to an opening groove P2 between the pn junction cells 24b and 24c without a gap between the transparent insulating film 34 constituting a bottom surface of the opening groove P2 and inner wall surfaces on both sides of the container 17. In this way, the barrier 18 can separate the region of the electrolytic chamber 16a where the pn junction cells 24a and 24b are included, and the region of the electrolytic chamber 16b where the pn junction cell 24c is included from each other such that there is no transmission of gas and transmission of ions occurs.

The barrier 18 is made of, for example, an ion exchange membrane, porous chamber glass, or the like. Additionally, the thickness of the barrier 18 is not particularly limited, and is preferably 20 to 500 μm.

Although the barrier 18 is attached to the opening groove P2 between the pn junction cells 24b and 24c, the invention is not limited to this. The barrier 18 may be attached to an opening groove P2 between the pn junction cells 24a and 24b, one pn junction cell 24a may be included on the electrolytic chamber 16a side, and the two pn junction cells 24b and 24c may be included on the electrolytic chamber 16b side.

In the illustrated example, the barrier 18 is provided in the opening groove P2 between the pn junction cells 24b and 24c within the container 17, the electrolytic chamber 16 within the container 17 is separated into the electrolytic chamber 16a for generating hydrogen and the electrolytic chamber 16b for generating oxygen by the barrier 18, and hydrogen gas and oxygen gas are separated and recovered. However, the invention is not limited to this. Hydrogen gas and oxygen gas may be simultaneously trapped without providing the barrier. By providing the separation membrane, an excellent effect that hydrogen gas and oxygen gas can be separated and recovered can be obtained. However, if there is a decrease in water decomposition efficiency due to the presence of the barrier, the decrease in water decomposition efficiency can be prevented by simultaneously trapping hydrogen gas and oxygen gas without providing the barrier.

The shielding plate 20 constitutes a shielding mechanism for cutting off at least a portion of light with the hydrogen gas generating part 14a is irradiated, and is provided to shield the hydrogen gas generating part 14a for a given time and at regular intervals.

It is preferable that the shielding plate 20 moves for a predetermine time and at regular intervals between a light irradiation position, as illustrated in FIGS. 1A and 1B, where the hydrogen gas generating part 14a is completely open and the hydrogen gas generating part 14a is irradiated with light, and a shielding position, as illustrated in FIGS. 2A and 2B, where the hydrogen gas generating part 14a is completely closed (covered) to perform shielding.

In the invention, this is because if the hydrogen gas generating part 14a is shielded for a given time, for example, for a short time of about five minutes and at regular intervals, for example, and at every two hours by the shielding plate 20, the hydrogen gas generation amount that that has decreased with the elapse of time can be recovered, and hydrogen gas can be generated stably for a long time on an average.

In a system that receives light to perform water decomposition to generate hydrogen gas as in the water decomposition apparatus of the invention, shielding that is the operation of stopping a water decomposition reaction is generally performed from a viewpoint of producing hydrogen gas because generation of the hydrogen gas disappears while shielding. However, the present inventor has considered that the performance degradation caused by the elapse of time, that is, a decrease in hydrogen gas generation efficiency, and a decrease in the hydrogen gas generation amount resulting therefrom are not avoided in long-time water decomposition, and has repeated earnest research. As a result, the present inventor has first found out a phenomenon in which hydrogen gas generation performance can be recovered simply by performing shielding for a predetermined short time and at regular intervals, that is, the hydrogen gas generation performance can be recovered simply by performing regular interval shielding that has not been known until now, has obtained the knowledge capable of solving a problem that, although the amount of generated gas in initial light irradiation is large in a related-art hydrogen gas and oxygen gas producing apparatus not including a mechanism that shields light at regular time intervals, the amount of generated gas decreases with the elapse of time, and has reached the invention.

In the invention, the light with which the hydrogen gas generating part 14a is irradiated, that is, the light that enters the hydrogen gas generating part 14a is preferably shielded 70% or more, more preferably shielded 90% or more, and most preferably shielded completely by the shielding plate 20. In addition, it is preferable to use a shielding plate whose transmittance of light is 30% or less in a case where the light with which the hydrogen gas generating part 14a is irradiated is shielded 70% or more by the shielding plate 20, it is more preferable to use a shielding plate whose transmittance of light is 10% or less in a case where the light is shielded 90% or more, and it is most preferable to use a non-transmission shielding plate whose transmittance of light is 0% in a case where the light is completely shielded.

In addition, the reason why it is preferable to shield the light, with which the hydrogen gas generating part 14a is irradiated is shielded by the shielding plate 20, 70% or more, is not completely clear. However, this is because it is considered that the performance recovery effect can be obtained by shielding the hydrogen gas generating part 14a 70% or more, thereby changing an electric potential at which the hydrogen generation catalyst 36a that decomposes (reduces) water responds to light.

In addition, although a configuration in which only the hydrogen gas generating part 14a consisting of the hydrogen generation catalyst 36a and the pn junction cell 24a is shielded by the shielding plate 20 is provided in the illustrated example, the invention is not limited to this. In addition to the hydrogen gas generating part 14a, the remaining pn junction cell 24b, and if necessary, the pn junction cell 24c may also shield light. In this way, it is considered that the performance recovery effect can be obtained by changing the electric potential at which the hydrogen generation catalyst 36a that decomposes (reduces) water responds to light.

In addition, in the invention, it is preferable that the shielding plate 20 shields the hydrogen gas generating part 14a for a very short time with respect to light irradiation (entering) time (exposure time) at regular time intervals. For example, the ratio of a time (shielding time) for which light is shielded by the shielding plate 20 and a time (light irradiation time) for which the hydrogen gas generating part 14a is opened by the shielding plate 20, in a case where the hydrogen gas generating part 14a is completely shielded by the shielding plate 20 preferably falls within a range of 1:1 to 1:1000, more preferably falls within a range of 1:2 to 1:100, and more preferably falls within a range of 1:20 to 1:100.

The reason why it is preferable to limit the ratio of the shielding time and the light irradiation time to the range of 1:1 to 1:1000 is as follows. That is, it is considered that, if the shielding time is longer than light irradiation time, the recovery effect resulting from shielding becomes high but the hydrogen gas generation amount as a while decreases because degradation of the water decomposition performance caused by continuous light irradiation is little and that, if the shielding time becomes shorter than 1/1000 of the light irradiation time, the recovery effect resulting from shielding become low and the hydrogen gas generation amount as a whole decreases because degradation of the water decomposition performance caused by long-time continuous light irradiation becomes great.

Meanwhile, in the invention, if degradation of the water decomposition performance caused by continuous light irradiation is early, it is preferable to set the value of the shielding time/the light irradiation time to be small because the hydrogen gas generation amount as a whole increases. However, if the water decomposition performance seldom deteriorates, it is preferable to make the value of the shielding time/the light irradiation time (ratio) as great as possible because the hydrogen gas generation amount as a whole increases. That is, it is preferable to appropriately set the value of the shielding time/the light irradiation time to a value within the above range according to the degree of degradation of the water decomposition performance caused by continuous light irradiation.

In addition, the degree of degradation of the water decomposition performance depends on a photoelectromotive force E (V) between the hydrogen gas generating part 14a and the oxygen gas generating part 14b as described in the following Formula (1) to be described below. Namely, as in a case where the following Formula (1) is satisfied, the degree of degradation of the water decomposition performance is greater if this photoelectromotive force E (V) has a value nearer a water decomposition starting voltage Es (V) of the electrolyte aqueous solution AQ. Thus, it is more preferable to set the value of optimal shielding time/light irradiation time (ratio) according to the degree of degradation of the water decomposition performance in the above-described photoelectromotive force E (V).

In addition, in the invention, it is preferable that the sum of the electromotive forces of the pn junction cells 24, the sum of the photoelectromotive forces of the three pn junction cells 24a, 24b, and 24c, in the illustrated example, that is, the photoelectromotive force E (V) between the hydrogen gas generating part 14a and the oxygen gas generating part 14b satisfies the following Formula (1) if the water decomposition starting voltage of the electrolyte aqueous solution AQ is defined as Es (V).

$$Es(V) < E(V) < Es + 0.6(V) \quad (1)$$

The reason why it is preferable to limit the photoelectromotive force in the water decomposition apparatus 10 of the invention to a range that satisfies above Formula (1) is as follows. That is, as in the invention, this is because, in a case where a photoelectromotive force generated in a system of a photoelectric conversion material having a pn junction and a photocatalyst (hydrogen generation catalyst) is slightly greater than a water decomposition starting voltage determined by the photocatalyst (hydrogen generation catalyst) and an electrolyte aqueous solution, degradation of the water decomposition performance with the elapse of time is remarkable, and recovery of the water decomposition performance caused by shielding for a short given time and at longer time intervals is remarkable. That is, this is because, in a case where the conditions of the above Formula (1) are satisfied, the recovery effect of the water decomposition performance is greater and the effect that the integrated amount of generation caused by stable generation of the hydrogen gas over a long time increases is high.

In addition, if the photoelectromotive force is sufficiently greater than the water decomposition starting voltage of the electrolyte aqueous solution, the degree of degradation of the water decomposition performance is small, and a difference between the gas generation amounts of hydrogen gas, oxygen gas, and the like in cases where the invention are applied and not applied.

Consequently, in the invention, it is preferable that the photoelectromotive force satisfies the above Formula (1).

In addition, in the invention, it is preferable that the hydrogen generation catalyst 36a is platinum (Pt), and it is preferable that the electrolyte aqueous solution AQ is an aqueous solution including sodium sulfate ($Na_2SO_4$).

Although it cannot be said that the reason is completely clarified, this is because it is believed that a reduction in the hydrogen generation amount in the hydrogen gas generating part (electrode) 14a with the elapse of time is caused by an interaction between platinum that is a catalyst, and an electrolyte aqueous solution including sodium sulfate ($Na_2SO_4$), for example, a solution of $Na_2SO_4 + NaH_2PO_4 + Na_2HPO_4$ (pH=6.8) that is the aqueous solution AQ. Meanwhile, this is because it is considered that platinum (Pt) is a catalyst with a lowest hydrogen generation overvoltage, and is therefore a promising material as the hydrogen generation catalyst 36a.

As illustrated in FIG. 4, the water decomposition apparatus 10 of the invention has the apparatus body 48 including the pn junction module 12, the hydrogen gas generating part 14a, the oxygen gas generating part 14b, the electrolytic chamber 16, the container 17, and the barrier 18, and a shielding mechanism 52 including the shielding plate 20 and a moving mechanism 50.

Here, the shielding plate 20 completely covers the light irradiation position where the hydrogen gas generating part 14a is completely opened by the moving mechanism 50 and is irradiated with light, and the hydrogen gas generating part 14a, and reciprocally moves between the light irradiation position and the shielding position where irradiation light is cut off.

The moving mechanism 50 consists of a winding transmission mechanism and a screw transmission mechanism that are driven by a driving source, and is provided to reciprocally move the shielding plate 20. The moving mechanism 50 has a motor 54 that is a driving source including a normal/reverse rotation mechanism, pulleys 56a and 56b attached to a rotating shaft 54a of the motor 54, traveling nuts 58a and 58b attached to both sides that sandwich the container 17 of the shielding plate 20 therebetween, drive screws 60a and 60b threadedly engaged with the traveling nuts 58a and 58b, respectively, pulleys 62a and 62b attached to the drive screws 60a and 60b, respectively, belts 64a and 64b wound between the pulley 56a and the pulley 62a and between the pulley 56b and the pulley 62b, respectively, and a controller 66 that is connected to the motor 54, controls rotation of the motor 54, and controls movement of the shielding plate 20. In addition, the drive screws 60*a* and 60*b* are respectively and rotatably supported by the support members 67*a* and 68*a* and the supporting members 67*b* and 68*b* fixed to the container 17 or a base that is not illustrated.

In the shielding mechanism 52, if the timing of shielding comes under the control of the controller 66, the motor 54 of the moving mechanism 50 starts its rotation and, for example, starts to rotate normally. If the motor 54 rotates normally, the normal rotation is transmitted to the pulleys 56*a* and 56*b* attached to the rotating shaft 54*a*, the pulleys 56*a* and 56*b* rotate normally, the normal rotations are respectively transmitted to the belts 64*a* and 64*b* wound the between the pulley 56*a* and the pulley 62*a* and between the pulley 56*b* and the pulley 62*b*, and the pulleys 62*a* and 62*b* rotate normally. The drive screws 60*a* and 60*b* rotate normally with the normal rotations of the pulleys 62*a* and 62*b*, respectively, the traveling nuts 58*a* and 58*b* that are threadedly engaged with the drive screws 60*a* and 60*b*, respectively, move in a direction of arrow a, and the shielding plate 20 to which the traveling nuts 58*a* and 58*b* are attached moves in the direction of arrow a, gradually covers and finally completely covers the hydrogen gas generating part 14*a* of the water decomposition apparatus 10, and cut off the light with which the hydrogen gas generating part 14*a* is irradiated.

If a predetermined shielding time ends and the timing of light irradiation comes, the motor 54 starts to rotate reversely, contrary to the above, under the control of the controller 66, the reverse rotation is transmitted to the rotating shaft 54*a*, the pulleys 56*a* and 56*b*, the belts 64*a* and 64*b*, the pulleys 62*a* and 62*b*, the drive screws 60*a* and 60*b*, and the traveling nuts 58*a* and 58*b*, the traveling nuts 58*a* and 58*b* move in a direction of arrow b, and the shielding plate 20 to which the traveling nuts 58*a* and 58*b* are attached moves in the direction of arrow b, gradually opens and finally completely opens the hydrogen gas generating part 14*a* of the water decomposition apparatus 10, and irradiates the hydrogen gas generating part 14*a* with irradiation light.

Such movement of the shielding plate 20 is controlled by the controller 66 according to the timing of shielding and light irradiation. Namely, the controller 66 controls the shielding mechanism 52, that is, the moving mechanism 50 such that the ratio of the shielding time and the light irradiation time falls within a range of 1:1 to 1:1000, more preferably 1:2 to 1:100, and most preferably 1:20 to 1:100 and such that the hydrogen gas generating part 14*a* is shielded at regular time intervals by the shielding plate 20.

In addition, the moving mechanism 50 that reciprocally moves the shielding plate 20 between the light irradiation position and the shielding position of the hydrogen gas generating part 14*a* is not necessarily limited to one in an illustrated example. Arbitrary moving mechanisms may be adopted as long as these moving mechanisms can reciprocally move the shielding plate 20. For example, a rack-and-pinion transmission mechanism, a gear transmission mechanism, a winding transmission mechanism, and a screw transmission mechanism may be adopted. Additionally, the shielding plate 20 is also not limited to one plate-shaped structure as in the illustrated example. Arbitrary shielding plates may be adopted as long as reciprocal movement thereof is possible. A shutter-shaped shielding plate in which a plurality of small pieces with a narrow width are bendably connected together may be adopted.

Although the water decomposition apparatus related to the first embodiment of the invention is configured as described above, the invention is not limited to this.

Figure 5:
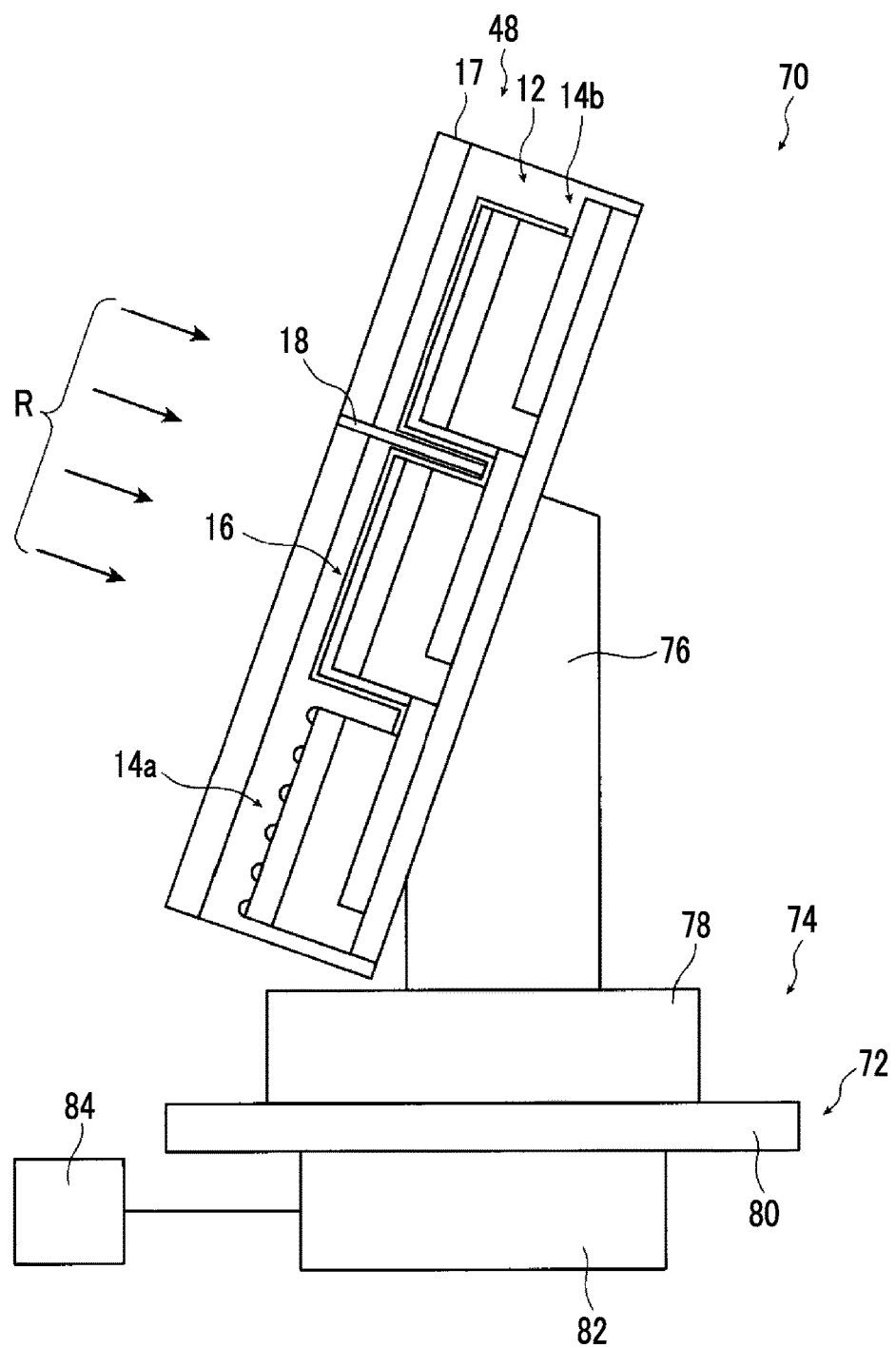
FIG. 5 is a front view schematically illustrating another example of the shielding mechanism of the water decomposition apparatus illustrated in FIG. 1A.

FIG. 5 is a front view schematically illustrating one example of a water decomposition apparatus related to a second embodiment of the invention.

As illustrated in this drawing, a water decomposition apparatus 70 has the apparatus body 48 including the pn junction module 12, the hydrogen gas generating part 14*a*, the oxygen gas generating part 14*b*, the electrolytic chamber 16, the container 17, and the barrier 18, and a shielding mechanism 74 including a rotational movement mechanism 72.

In addition, since the water decomposition apparatus 70 illustrated in FIG. 5 and the water decomposition apparatus 10 illustrated in FIGS. 1A and 4 have the same apparatus body 48 except that the shielding mechanism 74 and the shielding mechanism 52 are different from each other, the same constituent elements will be designated by the same referential signs, and the detailed description thereof will be omitted.

As illustrated in FIG. 5, the rotational movement mechanism 72 of the shielding mechanism 74 has a support member 76 that supports the apparatus body 48, in an inclined manner at a predetermined angle, a base 78 that supports the apparatus body 48 and the support member 76 in a placed manner thereon, a turntable 80 that rotatably supports the base 78, a rotational driving unit 82 that includes a driving source (not illustrated) and rotates the turntable 80, and a controller 84 that is connected to the rotational driving unit 82, controls rotation of the driving source (not illustrated), such as a motor of the rotational driving unit 82, to control the rotation of the turntable 80, and controls rotational movement of the apparatus body 48.

In the shielding mechanism 74 illustrated in FIG. 5, if the timing of shielding comes under the control of the controller 84 of the rotational movement mechanism 72, the driving source (not illustrated) of the rotational driving unit 82 starts its rotation, and the turntable 80 starts to rotate. If the turntable 80 rotates, the apparatus body 48 supported in an inclined manner at a predetermined angle via the base 78 and the support member 76 placed on and fixed to the turntable 80 rotates from the light irradiation position where the light-receiving surface of the hydrogen gas generating part 14*a* is directed to sunrays R and light enters. If the turntables 80 rotate 180°, reverses, and stops, the apparatus body 48 also rotates 180°, reverses, and stops. If a bottom surface of the container 17 of the apparatus body 48 has a light blocking effect similar to the above-described shielding plate 20, some or preferably all the sunrays R are reflected by the bottom surface of the container 17. Thus, the light-receiving surface of the hydrogen gas generating part 14*a* of the apparatus body 48 stops at the shielding position.

If the predetermined shielding time ends and the timing of light irradiation comes, the driving source (not illustrated) of the rotational driving unit 82 rotates under the control of the controller 84, and the turntable 80 rotates. If the turntable 80 rotates, the apparatus body 48 rotates from the shielding position where the light-receiving surface of the hydrogen gas generating part 14*a* is directed to the sunrays R toward the light irradiation position where the bottom surface of the container 17 is directed to the sunrays R and light enters. If the turntables 80 rotate 180°, reverses, and stops, the apparatus body 48 also rotates 180°, reverses, and stops. The apparatus body stops at the light irradiation position where the light-receiving surface of the hydrogen gas generating part 14*a* of the apparatus body 48 is directed to the sunrays R and light enters.

In this way, intended shielding at regular time intervals of the invention can be realized.

Such rotational movement of the apparatus body 48 is controlled by the controller 84 according to the timing of shielding and light irradiation. Namely, the controller 84 controls the shielding mechanism 52, that is, the moving mechanism 50 such that the ratio of the shielding time and the light irradiation time falls within a range of 1:1 to 1:1000, more preferably 1:2 to 1:100, and most preferably 1:20 to 1:100 and such that the hydrogen gas generating part 14a is shielded at regular time intervals depending on the rotational movement of the apparatus body 48.

In the example illustrated in FIG. 5, the apparatus body 48 that is inclined at a predetermined angle is placed on and fixed to the turntable 80 and is rotated. However, the invention is not limited to this. The container 17 may be made liquid-tight and the apparatus body 48 that is held substantially horizontally may be rotated so as to be vertically inverted, or the apparatus body 48 that is inclined at a predetermined angle may be turned and inverted with a back surface of the container as a center.

The water decomposition apparatus related to the second embodiment of the invention is configured as described above.

Additionally, in the invention, the water decomposition apparatus 10, 10a or 70 illustrated in FIGS. 1A and 1B, FIG. 4, FIGS. 3A and 3B, or FIG. 5 is used, and depending on the reciprocal movement of the shielding plate 20 or the rotational movement of the apparatus body 48, the hydrogen gas generating part 14a is irradiated and at least a portion of light that enters the hydrogen gas generating part 14a is shielded for a given time and at regular intervals. Accordingly, hydrogen gas and oxygen gas can be generated stably for a long time on an average, and the integrated gas generation amount can be made more than before.

Although the water decomposition apparatus and the water decomposition method of the invention have been described above in detail, it is natural that the invention is not limited to the above embodiments, and various improvements and modifications may be made without departing from the scope of the invention.

For example, in both of the above-described embodiments, the gas generating parts for generating hydrogen and for generating oxygen are provided on the light-receiving surface side of the junction cells of the pn junction module. However, the invention is not limited to this. Any one of the gas generating parts for generating hydrogen and for generating oxygen may be provided on the light-receiving surface side of the junction cells of the pn junction module.

EXAMPLES

Hereinafter, the water decomposition apparatus of the invention will be specifically described on the basis of examples. In addition, the invention is not limited to these examples.

Example 1

First, as Example 1, the integrated amount of generation of hydrogen gas was evaluated by repeating performing shielding for a short time after the water decomposition apparatus 10 illustrated in FIGS. 1A and 1B in which a photoelectric conversion layer was formed of a CIGS film was made, the electrolytic chamber 16 was filled with an electrolyte aqueous solution, and light irradiation was performed for a given time.

Figure 6:
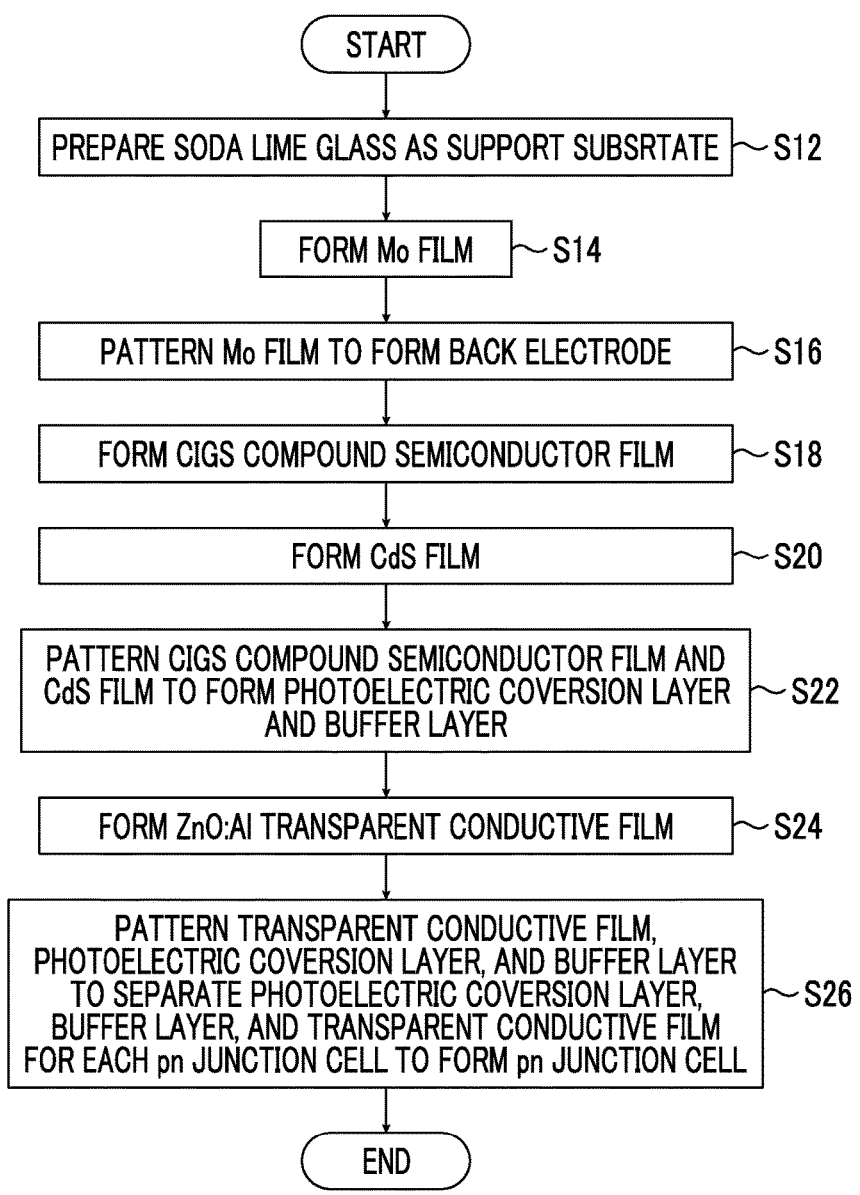
FIG. 6 is a flowchart illustrating an example of a process in which the water decomposition apparatus illustrated in FIG. 1 is manufactured.

The water decomposition apparatus of Example 1 was manufactured according to a making flow illustrated in a flowchart of FIG. 6.

First, in Step S12, a soda lime glass substrate was prepared as the supporting substrate 22.

Next, in Step S14, a Mo film was formed by forming Mo as a film of about 500 nm on a soda lime glass substrate using a sputtering method, and then, in Step S16, Mo film was cut and patterned by laser scribing, gaps serving as the separation grooves P1 are formed, and as illustrated in FIG. 1A, Mo back electrodes 26 were formed.

Next, in Step S18, a CIGS compound semiconductor film (CIGS film) serving as the photoelectric conversion layers 28 was formed as a film on the Mo back electrodes 26 so as to fill the gaps. In addition, in this Example 1, a granular raw material of high-purity copper (Cu) and indium (In) (purity of 99.9999%), high-purity gallium (Ga) (purity of 99.999%), and high-purity selenium (Se) (purity of 99.999%) was used as a vapor deposition source. A chromel-alumel thermocouple was used as a substrate temperature monitor. After a main vacuum chamber is vacuumed up to 10-6 Torr (1.3× 10-3 Pa), a vapor deposition rate from each evaporation source was controlled, and a CIGS film with a film thickness of about 1.8 µm was formed on film-forming conditions with a highest substrate temperature of 530° C.

Subsequently, in Step S20, a CdS thin film of about 90 nm was deposited as the buffer layers 30 by a solution growth method. Next, in Step S22, the CIGS compound semiconductor film and the CdS film that are formed on the Mo back electrodes 26 were integrated with each other, the opening grooves P2 that reach the back electrodes 26 were formed through patterning by a mechanical scribing method, and the photoelectric conversion layers 28 and the buffer layers 30 were then formed.

Subsequently, in Step S24, unnecessary portions (the tops of the buffer layers 30 of the left-end pn junction cell 24a) were masked so as fill the grooves, and a ZnO:Al film of a transparent conductive film was formed as the transparent electrodes 32 by a DC sputtering method on the buffer layers 30 formed in this way so as to have a thickness of 0.6 µm.

Next, in Step S26, the transparent electrodes (ZnO:Al transparent conductive film) 32, the buffer layers 30, and the photoelectric conversion layers 28 that are formed in this way were integrated with each other, and were cut by a mechanical scribing method and between the solar battery cells that are the adjacent pn junction cells 24 so as to form small opening grooves P2 that reach the back electrodes 26 again, and the photoelectric conversion layers 28, the buffer layers 30, and the transparent electrodes 32 are separately separated into the respective solar battery cells 24 so as to form the plurality of solar battery cells 24.

Thereafter, not the gas generation region but a portion intended to avoid contact with the electrolyte aqueous solution AQ, as illustrated in FIG. 1A, was covered with an insulating epoxy resin serving as the transparent insulating film 34.

Finally, surfaces of the solar battery cells 24, that is, CdS (buffer layers 30) surfaces that were not covered with epoxy resin were immersed a methanol aqueous solution including chloroplatinic acid, and A Pt catalyst was carried as the hydrogen generation catalyst 36a by an optical electrodeposition method.

This substrate is partitioned by an ion exchange membrane (Nafion: made by Sigma-Aldrich Co. LLC.) and is filled with 0.5 M of an $Na_2SO_4$ aqueous solution adjusted to pH=9.5, a water decomposition apparatus of two-chamber type cells was made as an artificial photosynthesis module of Example 1, and a shielding plate that is a shielding structure that shields light above this water decomposition apparatus was movably provided.

Figure 7:
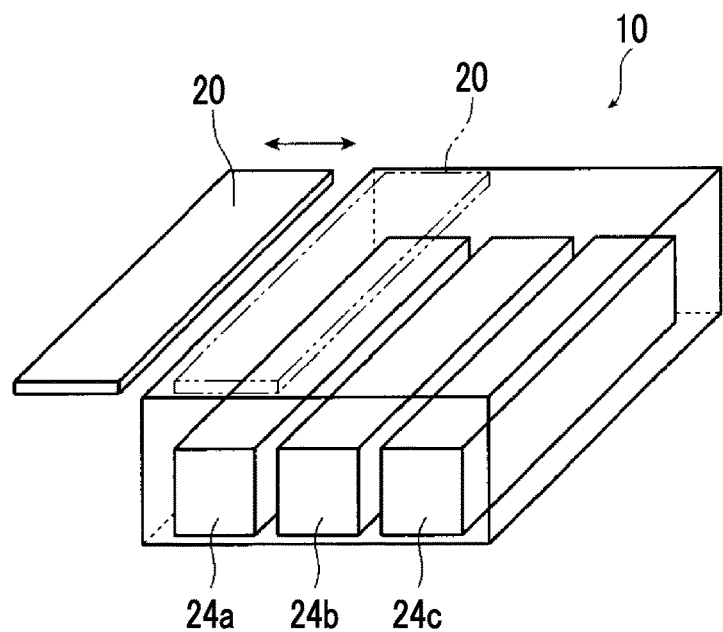
FIG. 7 is a perspective view schematically illustrating the action of the water decomposition apparatus of Example 1 of the invention.

The water decomposition apparatus 10 of the two-chamber type cells of Example 1 manufactured in this way is schematically illustrated in FIG. 7. Light irradiation was performed on the water decomposition apparatus 10 including the three pn junction cells (CIGS elements) 24a, 24b, and 24c schematically illustrated in FIG. 7 while shielding was performed at regular time intervals, and the integrated hydrogen gas generation amount after the lapse of 10 hours was evaluated. In this case, the shielding plate 20 that is a shielding structure that shields light above the water decomposition apparatus 10 was moved for a given time and at regular intervals such that a hydrogen generation region (the hydrogen gas generation surface of the pn junction cell 24a) where hydrogen gas was generated was shielded for 5 minutes by the shielding plate 20 during light irradiation for 120 minutes.

Figure 8:
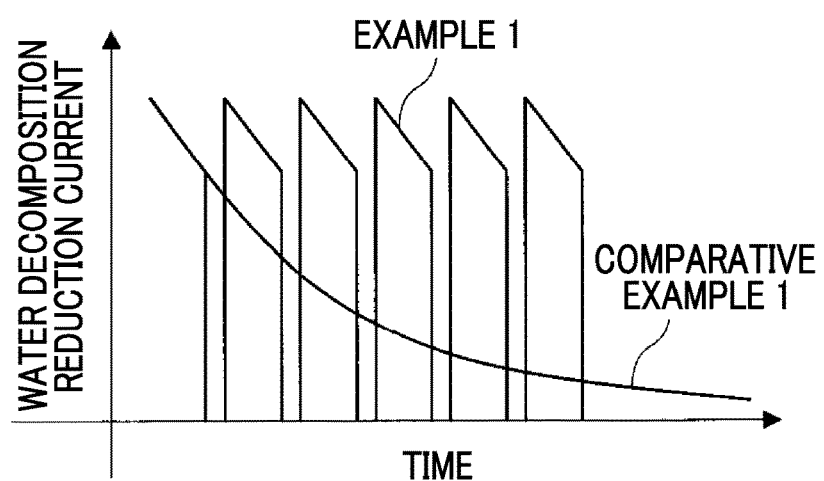
FIG. 8 is a graph illustrating a relationship between a moisture reduction current and elapsed time in the water decomposition apparatuses of Example 1 of the invention and Comparative Example 1.

In addition, a relationship between a moisture reduction current and elapsed time when light irradiation was performed while shielding is performed at regular time intervals on the water decomposition apparatus 10 of Example 1 of the invention is illustrated in FIG. 8.

Example 2

Next, as Example 2, the integrated amount of generation of hydrogen gas was evaluated by repeating performing shielding for a short time (5 minutes) after the water decomposition apparatus 10 illustrated in FIGS. 1A and 1B in which photoelectric conversion layers were formed of a CGSe film was made, the electrolytic chamber 16 was filled with an electrolyte aqueous solution, and light irradiation was performed for a given time (120 minutes).

A water decomposition apparatus of Example 2 was made similar to Example 1 except that the photoelectric conversion layers were changed from the CIGS film to the CGSe film.

First, formation of the Mo back electrodes 26 having the gaps onto the soda lime glass substrate was performed similar to Example 1.

Next, a CGSe compound semiconductor film (CGSe film) serving as the photoelectric conversion layers 28 was formed as a film on the Mo back electrodes 26 so as to fill the gaps. In addition, in this Example 2, a granular raw material of high-purity copper (Cu) (purity of 99.9999%), high-purity gallium (Ga) (purity of 99.999%), and high-purity selenium (Se) (purity of 99.999%) was used as a vapor deposition source. A chromel-alumel thermocouple was used as a substrate temperature monitor. After a main vacuum chamber is vacuumed up to 10-6 Torr ($1.3 \times 10^{-3}$ Pa), a vapor deposition rate from each evaporation source was controlled, and a CGSe film with a film thickness of about 1.8 μm was formed on film-forming conditions with a highest substrate temperature of 530° C.

Subsequently, a CdS thin film of about 90 nm was deposited as the buffer layers 30 by a solution growth method. The CGSe compound semiconductor film and the CdS film that are formed on the Mo back electrodes 26 were integrated with each other, grooves that reach the back electrodes 26 were formed through patterning by a mechanical scribing method, and the photoelectric conversion layers 28 and the buffer layers 30 were then formed.

Thereafter, a water decomposition apparatus of two-chamber type cells of Example 2 in which the shielding plate 20 that is a shielding structure that shields light above this water decomposition apparatus was movably provided was made similar to Example 1.

Light irradiation was performed on the water decomposition apparatus of the two-chamber type cells of Example 2 made in this way while shielding was performed at regular time intervals, similar to Example 1, and the integrated hydrogen gas generation amount after the lapse of 10 hours was evaluated.

Example 3

Next, as Example 3, the integrated amount of generation of hydrogen gas was evaluated by repeating performing shielding for a short time (5 minutes) after the water decomposition apparatus 10 illustrated in FIGS. 1A and 1B in which photoelectric conversion layers were formed of a CZTS film was made, the electrolytic chamber 16 was filled with an electrolyte aqueous solution, and light irradiation was performed for a given time (120 minutes).

A water decomposition apparatus of Example 3 was made similar to Example 1 except that the photoelectric conversion layers are changed from the CIGS film to the CZTS film.

First, formation of the Mo back electrodes 26 having the gaps onto the soda lime glass substrate was performed similar to Example 1.

Next, a CZTS film serving as the photoelectric conversion layers 28 was formed as a film on the Mo back electrodes 26 so as to fill the gaps serving as the separation grooves P1. In addition, in this Example 3, a granular raw material of high purity copper (Cu) and zinc (Zn) (purity of 99.999%), high-purity tin (Sn) (purity of 99.999%), and high-purity sulfur (S) (purity of 99.999%) was used as a vapor deposition source. A chromel-alumel thermocouple was used as a substrate temperature monitor. After a main vacuum chamber is vacuumed up to 10-6 Torr ($1.3 \times 10^{-3}$ Pa), a vapor deposition rate from each evaporation source was controlled, and a CZTS film with a film thickness of about 1.8 μm was formed on film-forming conditions with a highest substrate temperature of 530° C.

Subsequently, a CdS thin film of about 90 nm was deposited as the buffer layers 30 by a solution growth method. The CZTS compound semiconductor film and the CdS film that are formed on the Mo back electrodes 26 were integrated with each other, grooves that reach the back electrodes 26 were formed through patterning by a mechanical scribing method, and the photoelectric conversion layers 28 and the buffer layers 30 were then formed.

Thereafter, a water decomposition apparatus of two-chamber type cells of Example 3 in which the shielding plate 20 that is a shielding structure that shields light above this water decomposition apparatus was movably provided was made similar to Example 1.

Light irradiation was performed on the water decomposition apparatus of the two-chamber type cells of Example 3 made in this way while shielding was performed at regular time intervals, similar to Example 1, and the integrated hydrogen gas generation amount after the lapse of 10 hours was evaluated.

Comparative Example 1

Next, as Comparative Example 1, a water decomposition apparatus of two-chamber type cells was made similar to Example 1 except that providing the shielding plate 20 that is a shielding structure that shields light above the water decomposition apparatus was also omitted.

Light irradiation was continuously performed on the water decomposition apparatus of the two-chamber type cells of Comparative Example 1 made in this way, and the integrated hydrogen gas generation amount after the lapse of 10 hours was evaluated.

In addition, a relationship between a moisture reduction current and elapsed time when light irradiation was performed while shielding is continuously performed on the water decomposition apparatus of Comparative Example 1 is illustrated in FIG. 8.

Comparative Example 2

Next, as Comparative Example 2, a water decomposition apparatus of two-chamber type cells was made similar to Example 2 except that providing the shielding plate 20 that is a shielding structure that shields light above the water decomposition apparatus was omitted.

Light irradiation was continuously performed on the water decomposition apparatus of the two-chamber type cells of Comparative Example 2 made in this way, and the integrated hydrogen gas generation amount after the lapse of 10 hours was evaluated.

Comparative Example 3

Next, as Comparative Example 3, a water decomposition apparatus of two-chamber type cells was made similar to Example 3 except that providing the shielding plate 20 that is a shielding structure that shields light above the water decomposition apparatus was omitted.

Light irradiation was continuously performed on the water decomposition apparatus of the two-chamber type cells of Example 3 made in this way, and the integrated hydrogen gas generation amount after the lapse of 10 hours was evaluated.

The results when the integrated amounts of generation of hydrogen gas after the elapse of 10 hours in the water decomposition apparatuses of the above-described Examples 1 to 3 and Comparative Examples 1 to 3 were obtained as relative values when the integrated amount of generation of hydrogen gas of Comparative Example 1 was 1 are illustrated in Table 1.

TABLE 1

|  | Integrated Amount of Generation of Hydrogen Gas (Relative Value) |
| --- | --- |
| Example 1 | 4 |
| Example 2 | 1.5 |
| Example 3 | 1.5 |
| Comparative Example 1 | 1 |
| Comparative Example 2 | 0.5 |
| Comparative Example 3 | 0.5 |

As being clear from FIG. 8, in Example 1 of the invention, water decomposition is performed while shielding is performed for 5 minutes in each light irradiation of 120 minutes, it can be seen that, even if light irradiation and shielding are repeated, water decomposition reduction current that has decreased in the light irradiation for 120 minutes is sufficiently recovered up to a level at the start of the light irradiation with light irradiation after the shielding for 5 minutes.

In contrast, in Comparative Example 1, light irradiation is continuously performed. Thus, it can be seen that the water decomposition reduction current decreases continuously with the elapse of time, and decreases remarkably in long-time light irradiation.

In addition, since the value of the water decomposition reduction current is proportional to the amount of generated hydrogen gas, it can be seen that the integrated amount of generation of hydrogen gas after the elapse of a long time in Comparative Example 1 is decreases extremely compared to that in Example 1 of the invention.

The results are clear also from Table 1. That is, it can be seen that the respective integrated amounts of generation of hydrogen gas in Examples 1 to 3 are more than any of the integrated amounts of generation of the hydrogen gas in Comparative Examples 1 to 3 and the integrated amount of generation of hydrogen gas is large even over a long time. Particularly in Example 1 in which the photoelectric conversion layers consists of the CIGS compound semiconductor film, it can be seen that the integrated amount of generation of hydrogen gas is larger compared to those in Examples 2 and 3 in which the photoelectric conversion layers consists of the CGSe and CZTS compound semiconductor films.

Example 4

Figure 9:
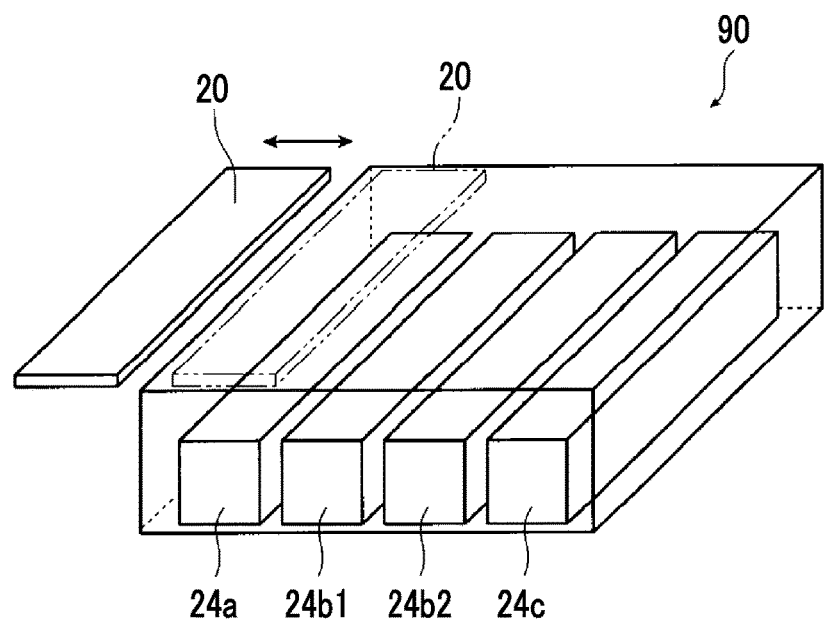
FIG. 9 is a perspective view schematically illustrating the action of the water decomposition apparatus of Example 4 of the invention.

Next, as Example 4, as schematically illustrated in FIG. 9, a water decomposition apparatus 90 of two-chamber type cells of Example 4 was made similar to Example 1 except that the water decomposition apparatus 90 including four pn junction cells (CIGS elements) 24a, 24b1, 24b2, and 24c that are connected in series is provided with respect to the water decomposition apparatus 10 of Example 1 including the three pn junction cells (CIGS elements) 24a, 24b, and 24c that are connected in series as schematically illustrated in FIG. 7.

Light irradiation was performed on the water decomposition apparatus 90 of the two-chamber type cells of Example 4 made in this way while shielding was performed at regular time intervals, similar to Example 1, and the integrated hydrogen gas generation amount after the lapse of 10 hours was evaluated. In this case, similar to Example 1, the shielding plate 20 that is a shielding structure that shields light above the water decomposition apparatus 10 was moved for a given time and at regular intervals such that a hydrogen generation region (the hydrogen gas generation surface of the pn junction cell 24a) where hydrogen gas was generated was shielded for 5 minutes by the shielding plate 20 during light irradiation for 120 minutes.

Figure 10:
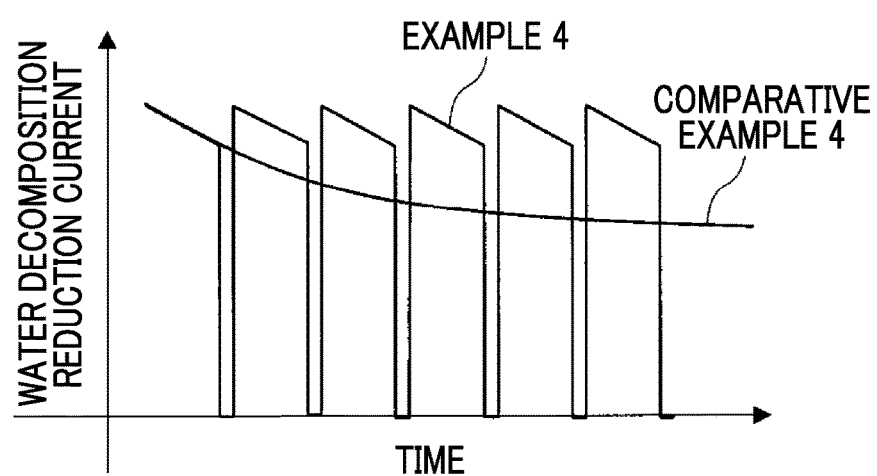
FIG. 10 is a graph illustrating a relationship between the moisture reduction current and the elapsed time in the water decomposition apparatuses of Example 4 of the invention and Comparative Example 4.

In addition, a relationship between a moisture reduction current and elapsed time when light irradiation was performed while shielding is performed at regular time intervals on the water decomposition apparatus 90 of Example 4 of the invention is illustrated in FIG. 10.

Comparative Example 4

Next, as Comparative Example 4, a water decomposition apparatus of serial two-chamber type cells in which pn junction cells are four was manufactured similar to Example 4 except that providing the shielding plate 20 that is a shielding structure that shields light above the water decomposition apparatus is also omitted.

Light irradiation was continuously performed on the water decomposition apparatus of the two-chamber type cells of Comparative Example 4 manufactured in this way, and the integrated hydrogen gas generation amount after the elapse of 10 hours was evaluated.

In addition, the relationship between the moisture reduction current and the elapsed time when the light irradiation was continuously performed on the water decomposition apparatus of Comparative Example 4 is illustrated in FIG. 10.

The results when the integrated amounts of generation of hydrogen gas after the elapse of 10 hours in the water decomposition apparatuses of the above-described Example 4 and Comparative Example 4 was obtained as relative values when the integrated amount of generation of hydrogen gas after the elapse of 10 hours of Comparative Example 4 is 1 are illustrated in Table 1.

TABLE 2

|  | Integrated Amount of Generation of Hydrogen Gas (Relative Value) |
| --- | --- |
| Example 4 | 1.5 |
| Comparative Example 4 | 1 |

As being clear from FIG. 10, in Example 4 of the invention, water decomposition is performed while shielding is performed for 5 minutes in each light irradiation for 120 minutes. Thus, it can be seen that, even if light irradiation and shielding are repeated, the water decomposition reduction current that has decreased in the light irradiation for 120 minutes is sufficiently recovered to its original level at the start of the light irradiation in the light irradiation after the shielding for 5 minutes.

In contrast, in Comparative Example 4, the light irradiation is continuously performed. Thus, it can be seen that the water decomposition reduction current decreases continuously with the elapse of time, and decreases considerably in long-time light irradiation. However, in Comparative Example 4 illustrated in FIG. 10, it can be seen that a decrease in the water decomposition reduction current is gentle compared with that of Comparative Example 1 illustrated in FIG. 8.

In addition, as described above, the value of the water decomposition reduction current is proportional to the amount of generated hydrogen gas. Thus, it can be seen that the integrated amount of generation of hydrogen gas after the elapse of a long time in Example 4 of the invention is large compared to that in Comparative Example 4.

This result is clear also from Table 2. Thus, it can be seen that the integrated amount of generation of hydrogen gas after the elapse of a long time in Example 4 is large compared to that in Comparative Example 4 and the integrated amount of generation of hydrogen gas is large even over a long time.

It can be said from above that, since Example 4 of the serial decomposition apparatus in which pn junction cells are four has a higher photoelectromotive force than and also a greater height of the photoelectromotive force with respect to the water decomposition starting voltage than Example 1 of the serial decomposition apparatus in which pn junction cells are three, a decrease in the value of the water decomposition reduction current, that is, the degradation of the water decomposition performance with the elapse of time is little, and also a recovery effect resulting from by shielding at regular time intervals is also little.

As a result, it can be seen that the invention can obtain a great effect in the water decomposition apparatus that cannot make photoelectromotive force not much high with respect to the water decomposition starting voltage.

The effects of the invention are clear from the above results.

In addition, although the invention is configured as described above, the invention may be configured as follows.

Namely, in the invention, an inorganic semiconductor film may have a light-receiving surface on one surface and a back surface on the other surface, is constituted with an inorganic semiconductor, and consists of a pn junction module consisting of a plurality of pn junctions that are connected in series, two gas generating parts of a hydrogen gas generating part and an oxygen gas generating part may be respectively provided at an open end of a pn junction at one terminal of the pn junction module and an open end of a pn junction at another terminal thereof, on the light-receiving surface side of the pn junction module, the junction module may be connected in series by connecting the back surface of one pn junction of the pn junctions adjacent to each other a light-receiving surface of the other pn junction thereof together with a conductive material, and a barrier may partition an electrolytic chamber into two regions including a region that contains hydrogen generated in one gas generating part coming into contact with an electrolyte aqueous solution, and a region that contains oxygen generated in the other gas generating part coming into contact with the electrolyte aqueous solution by causing light to enter the light-receiving surface of the pn junction module.

Additionally, a light-permeable insulating material that covers a conductive material surface of the pn junction module, excluding the two gas generating parts may be further included.

Additionally, an absorption wavelength end of the inorganic semiconductor film may be 800 nm or more.

Additionally, an n-type surface of each of the pn junctions may be the light-receiving surface, and a p-type surface of the pn junction may be the back surface, and a back electrode provided in the p-type surface of the pn junction may be further included.

Additionally, the n-type surface of the pn junction at the one terminal of the pn junction module may function as the one gas generating part that generates hydrogen, and a light-permeable conductive film made of a light-permeable conductive material that covers the n-type surfaces of the remaining pn junctions of the pn junction module, respectively, excluding the pn junction at the one terminal may be further included.

Otherwise, a light-permeable conductive film made of a light-permeable conductive material that covers the n-type surfaces of the pn junctions may be further included, and the light-permeable conductive film that covers the n-type surface of the pn junction at the one terminal of the pn junction module may function as the one gas generating part that generates hydrogen.

Otherwise, a light-permeable conductive film made of a light-permeable conductive material that covers the n-type surfaces of the pn junctions may be further included, one gas generating part that generates hydrogen may be electrically connected to the light-permeable conductive film that covers the n-type surface of the pn junction at the one terminal of the pn junction module, and the barrier may be provided between the one gas generating part and the pn junction at the one terminal.

Additionally, a portion of the back electrode provided on the p-type surface of the pn junction at the other terminal of the pn junction module may function as another gas generating part that generates oxygen.

Otherwise, a reverse pn junction provided on an extending portion of the back electrode provided on the p-type surface of the pn junction at the other terminal of the pn junction module and provided in reverse junction order may be further included, the p-type surface of this reverse pn junction may serve as the light-receiving surface, and an n-type-side surface of the reverse pn junction may come in contact with the extending portion of the back electrode, the p-type surface of the reverse pn junction may function as another gas generating part that generates oxygen, and a light-permeable conductive film made of a light-permeable conductive material that covers the p-type surface of the reverse pn junction that is the light-receiving surface may be further included, and the light-permeable conductive film that covers the p-type surface of the reverse pn junction may function as the other gas generating part that generates oxygen.

Otherwise, an extending portion of the back electrode provided on the p-type surface of the pn junction at the other terminal of the pn junction module may function as another gas generating part that generates oxygen, and the barrier may be provided between the other gas generating part, and the pn junction at the other terminal of the pn junction module.

Moreover, an oxygen generation catalyst provided on a surface (gas generation surface) of the oxygen gas generating part may be further included, and metal, CoOx, or IrO2 may be used as the oxygen generation catalyst.

Additionally, the amounts of generated current caused by light irradiation in the plurality of pn junctions may be equal to each other, and the light-receiving area of the light-receiving surfaces of the plurality of pn junction may be an equal to each other.

EXPLANATION OF REFERENCES 10, 10a, 70, 90: water decomposition apparatus
12, 12a: pn junction module
14a, 14c: hydrogen gas generating part
14b, 14d: oxygen gas generating part
16, 16a, 16b: electrolytic chamber
17: container
18: barrier
20: shielding plate
22: supporting substrate
24, 24a, 24b, 24b1, 24b2, 24c: pn junction cell (solar battery cell)
26, 26a: back electrode
28: photoelectric conversion layer
30: buffer layer
32: transparent electrode
34: transparent insulating film
36a: hydrogen generation catalyst
36b: oxygen generation catalyst
48: apparatus body
50: moving mechanism
52, 74: shielding mechanism
72: rotational movement mechanism

What is claimed is:

1. A water decomposition apparatus that decomposes an electrolyte aqueous solution into hydrogen gas and oxygen gas by means of light, the water decomposition apparatus comprising:
   a hydrogen gas generating part that includes an inorganic semiconductor film having a pn junction and one surface as a light-receiving surface, and a hydrogen generation catalyst and that generates hydrogen gas;
   an oxygen gas generating part that is formed on the other surface of the inorganic semiconductor film and generates oxygen gas;
   an electrolytic chamber that contains (a) the electrolyte aqueous solution, coming into contact with the hydrogen gas generating part and the oxygen gas generating part, (b) the hydrogen gas generated in the hydrogen gas generating part, and (c) the oxygen gas generated in the oxygen gas generating part; and
   a shielding mechanism that is configured to shield at least a portion of light with which the hydrogen gas generating part is irradiated,
   wherein the shielding mechanism is configured to shield the hydrogen gas generating part at regular time intervals.

2. The water decomposition apparatus according to claim 1,
   wherein the shielding mechanism shields 70% or more of the light with which the hydrogen gas generating part is irradiated.

3. The water decomposition apparatus according to claim 1,
   wherein the shielding mechanism includes a shielding structure, and
   wherein the shielding structure moves a light irradiation position where the hydrogen gas generating part is irradiated with light and a shielding position where the hydrogen gas generating part is shielded, at the regular time intervals.

4. The water decomposition apparatus according to claim 1,
   wherein the shielding mechanism is a rotational movement mechanism that rotationally moves an apparatus body including the hydrogen gas generating part, the oxygen gas generating part, and the electrolytic chamber,
   wherein the apparatus body is moved to a light irradiation position where the hydrogen gas generating part is irradiated with light, and a shielding position where the hydrogen gas generating part is shielded, at the regular time intervals by the rotational movement mechanism.

5. The water decomposition apparatus according to claim 1,
   wherein a photoelectromotive force E (V) between the hydrogen gas generating part and the oxygen gas generating part satisfy the following Formula (1) if a water decomposition starting voltage of the electrolyte aqueous solution is defined as Es (V), $$Es(V) < E(V) < Es + 0.6(V) \tag{1}$$

6. The water decomposition apparatus according to claim 1,
   wherein the hydrogen generation catalyst is platinum.

7. The water decomposition apparatus according to claim 1,
   wherein the electrolyte aqueous solution includes $Na_2SO_4$.

8. The water decomposition apparatus according to claim 1, further comprising:
   a barrier that partitions the electrolytic chamber into a region including the hydrogen gas generating part and a region including the oxygen gas generating part and has ion permeability and gas non-permeability.

9. The water decomposition apparatus according to claim 1, wherein the inorganic semiconductor film includes a copper indium gallium selenide compound semiconductor.

10. The water decomposition apparatus according to claim 1,
wherein the inorganic semiconductor film includes a copper zinc tin sulfide compound semiconductor.

11. The water decomposition apparatus according to claim 1, further comprising:
a controller that controls the shielding mechanism such that a ratio of a shielding time when the hydrogen gas generating part is shielded by the shielding mechanism to a light irradiation time when the hydrogen gas generating part is irradiated with light by the shielding mechanism is 1:2 to 1:100 and the hydrogen gas generating part is shielded at the regular time intervals by the shielding mechanism.

12. A water decomposition method of decomposing an electrolyte aqueous solution into hydrogen gas and oxygen gas by means of light, using a water decomposition apparatus according to claim 1, the water decomposition method comprising:
shielding at least a portion of light with which the hydrogen gas generating part is irradiated, at the regular time intervals.

13. The water decomposition method according to claim 12,
wherein 70% or more of the light with which the hydrogen gas generating part is irradiated is shielded.

14. The water decomposition method according to claim 12,
wherein the shielding is performed by moving a shielding structure between a light irradiation position where the hydrogen gas generating part is irradiated with light and a shielding position where the hydrogen gas generating part is shielded, at the regular time intervals.

15. The water decomposition method according to claim 12,
wherein the shielding is performed by rotationally moving the water decomposition apparatus between a light irradiation position where the hydrogen gas generating part is irradiated with light and a shielding position where the hydrogen gas generating part is shielded, at the regular time intervals.

16. The water decomposition method according to claim 12,
wherein a photoelectromotive force E (V) between the hydrogen gas generating part and the oxygen gas generating part satisfy the following Formula (1) if a water decomposition starting voltage of the electrolyte aqueous solution is defined as Es (V), $$Es(V) < E(V) < Es + 0.6(V) \quad (1).$$

17. The water decomposition method according to claim 12,
wherein the hydrogen generation catalyst is platinum.

18. The water decomposition method according to claim 12,
wherein the electrolyte aqueous solution includes $Na_2SO_4$.

19. The water decomposition method according to claim 12,
wherein the inorganic semiconductor film includes a copper indium gallium selenide compound semiconductor.

20. The water decomposition method according to claim 12,
wherein the inorganic semiconductor film includes a copper zinc tin sulfide compound semiconductor.

21. The water decomposition method according to claim 12,
wherein a ratio of a shielding time when the hydrogen gas generating part is shielded by the shielding mechanism to a light irradiation time when the hydrogen gas generating part is irradiated with light by the shielding mechanism is 1:2 to 1:100.

* * * * *